United States Patent
El-halwagy et al.

(10) Patent No.: US 12,375,089 B2
(45) Date of Patent: Jul. 29, 2025

(54) REDUCING DUTY CYCLE MISMATCH OF CLOCK SIGNALS FOR CLOCK TRACKING CIRCUITS

(71) Applicant: Microchip Technology Incorporated, Chandler, AZ (US)

(72) Inventors: Waleed El-halwagy, Ottawa (CA); Youcef Fouzar, Ottawa (CA); Kristopher Kshonze, Ottawa (CA); William Roberts, Highland, UT (US); Faizal Warsalee, Sittsville (CA)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/167,716

(22) Filed: Feb. 10, 2023

(65) Prior Publication Data

US 2024/0007093 A1    Jan. 4, 2024

Related U.S. Application Data

(60) Provisional application No. 63/367,434, filed on Jun. 30, 2022.

(51) Int. Cl.
| | |
|---|---|
| *H03L 7/081* | (2006.01) |
| *H03K 5/135* | (2006.01) |
| *H03K 5/156* | (2006.01) |
| *H03K 7/08* | (2006.01) |

(52) U.S. Cl.
CPC ........... *H03L 7/0812* (2013.01); *H03K 5/135* (2013.01); *H03K 5/1565* (2013.01); *H03K 7/08* (2013.01)

(58) Field of Classification Search
None
See application file for complete search history.

(56) References Cited

U.S. PATENT DOCUMENTS

| | | | |
|---|---|---|---|
| 5,963,071 A | 10/1999 | Dowlatabadi | |
| 6,967,514 B2 * | 11/2005 | Kizer | H03K 5/1565 327/299 |
| 7,199,632 B2 | 4/2007 | Chun et al. | |
| 9,634,678 B1 | 4/2017 | Caffee et al. | |
| 10,367,493 B1 | 7/2019 | Addepalli et al. | |
| 2008/0111604 A1 | 5/2008 | Boerstler et al. | |

(Continued)

FOREIGN PATENT DOCUMENTS

| | | |
|---|---|---|
| EP | 2259428 A2 | 12/2010 |
| WO | 2014/035771 A2 | 3/2014 |

OTHER PUBLICATIONS

International Search Report for International Application No. PCT/US2023/062424, mailed Jul. 19, 2023, 6 pages.

(Continued)

*Primary Examiner* — Cassandra F Cox
(74) *Attorney, Agent, or Firm* — TraskBritt

(57) ABSTRACT

One or more examples relate to a method. The method includes: receiving up/down error signals indicative of duty cycle mismatch between a reference clock signal and a changed feedback clock signal that represents an output clock signal generated by a clock tracking circuit to track the reference clock signal; setting a duty cycle of a changed feedback clock signal to reduce duty cycle mismatch indicated by the up/down error signals; and providing the changed feedback clock having set duty cycle.

17 Claims, 19 Drawing Sheets

(56) References Cited

U.S. PATENT DOCUMENTS

2009/0128207 A1* 5/2009 Chang .................. H03K 5/1565
327/175
2010/0188126 A1 7/2010 Cheung et al.
2013/0063191 A1 3/2013 Patil et al.

OTHER PUBLICATIONS

International Search Report for International Application No. PCT/US2023/062426, mailed Jun. 12, 2023, 6 pages.
Written Opinion of the International Searching Authority for International Application No. PCT/US2023/062424, mailed Jul. 19, 2023, 7 pages.
Written Opinion of the International Searching Authority for International Application No. PCT/US2023/062426, mailed Jun. 12, 2023, 7 pages.

* cited by examiner

REDUCING DUTY CYCLE MISMATCH OF CLOCK SIGNALS FOR CLOCK TRACKING CIRCUITS

CROSS-REFERENCE TO RELATED APPLICATION

This application claims the benefit under 35 U.S.C. § 119(e) of the priority date of U.S. Provisional Patent Application Ser. No. 63/367,434, filed Jun. 30, 2022, for DUTY CYCLE CORRECTION AND MATCHING TECHNIQUES, the contents and disclosure of which is incorporated herein in its entirety by this reference.

FIELD

One or more examples relate, generally, to clock tracking circuits for tracking an output clock to a reference clock. More specifically, one or more examples relate to reducing duty cycle mismatch between a reference clock and a feedback clock that represents an output clock generated by a clock tracking circuit to track the reference clock.

BACKGROUND

Clock tracking circuits such as phase locked loops and delay locked loops, are circuits utilized to track clocks and other oscillating signals. An output signal of a clock tracking circuit is locked to the phase and frequency of a reference signal. Clock tracking circuits are utilized in a variety of operational contexts, including when two signals having known relationships are utilized to transmit information.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

Figure 1:
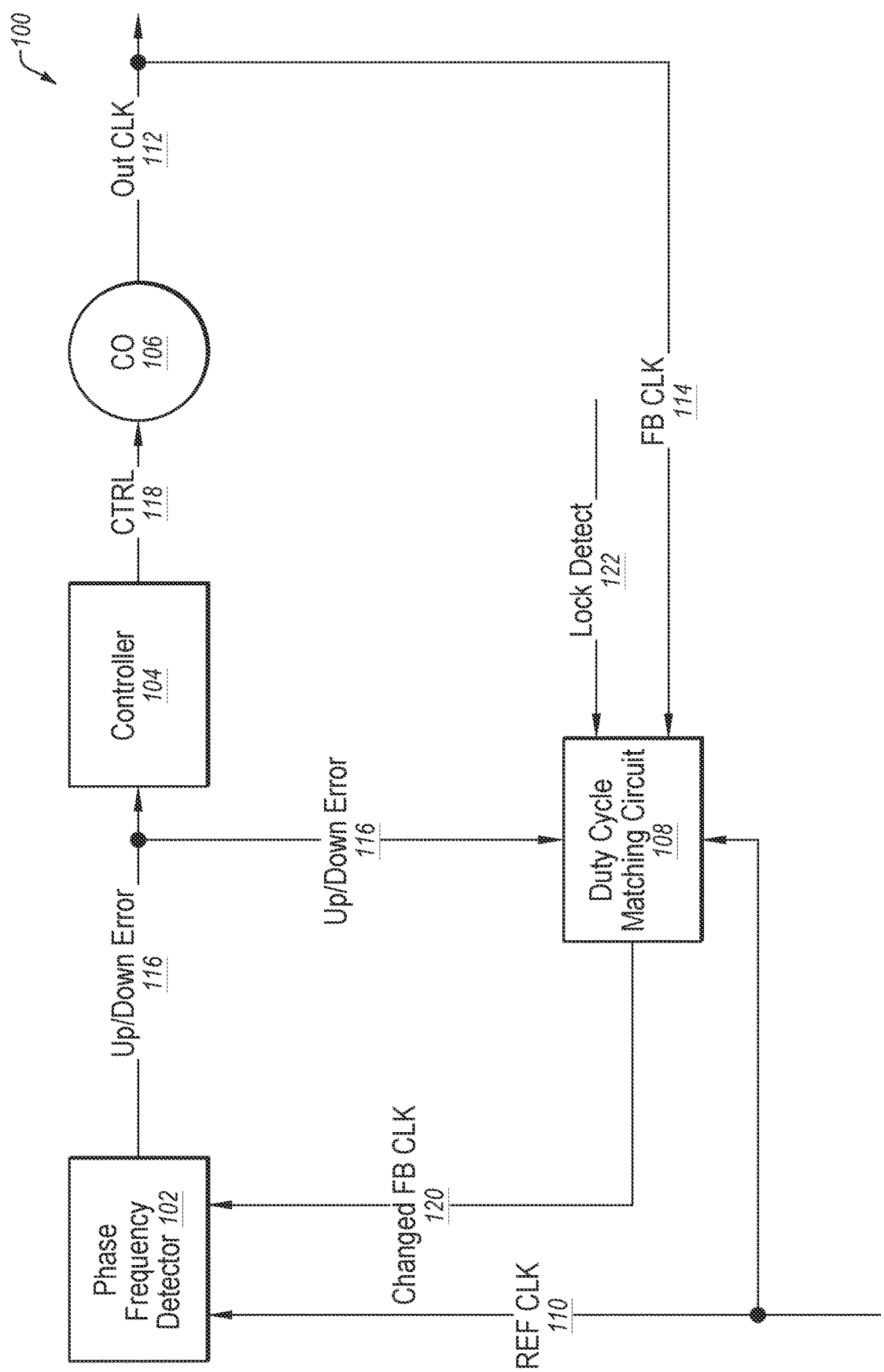
FIG. 1 is a block diagram depicting an apparatus to track a clock, in accordance with one or more examples.

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example of this disclosure to the specified components, steps, features, functions, or the like.

It will be readily understood that the components of the examples as generally described herein and illustrated in the drawing could be arranged and designed in a wide variety of different configurations. Thus, the following description of various examples is not intended to limit the scope of the present disclosure, but is merely representative of various examples. While the various aspects of the examples may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, any relational term, such as "over," "under," "on," "underlying," "upper," "lower," without limitation, is used for clarity and convenience in understanding the disclosure and accompanying drawings and does not connote or depend on any specific preference, orientation, or order, except where the context clearly indicates otherwise.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

A clock signal or just a "clock," is a signal that oscillates between a high state and a low state in a reliably predictable manner. One or more circuits can be responsive to a rising or falling edge of a clock to coordinate its actions.

Clock tracking circuits (e.g., a phase locked loop (PLL) or delay locked loop (DLL), without limitation) are used, generally, to generate an output clock that tracks a reference clock—e.g., are phase and frequency locked to the reference clock, without limitation. In a typical clock tracking circuit, an oscillator is controlled via one or more control paths to generate an output clock having the phase and frequency of the reference clock. When the phase or frequency of a feedback clock is different than the phase or frequency of the reference clock (also called phase or frequency "offset" or "error"), the clock tracking circuit generates control signals via the one or more control paths to correct phase difference and urge the oscillator's native frequency toward the frequency of the reference clock. When one or both of the respective rising and falling edges of the output clock and the reference clock are aligned for a suitable time duration, the PLL is deemed "locked." Single edge locked clock tracking circuits utilize a single edge (i.e., a rising edge or a falling edge) of the output clock and the reference cock to determine locked state. Dual edge locked clock tracking circuits utilize both edges (i.e., the rising edge and the falling edge) of the output clock and the reference clock to determine locked state.

At certain frequency ranges, a clock tracking circuit may exhibit jitter, which is an integration of phase noise in specific bandwidths.

Duty cycle distortion and duty cycle mismatch may contribute to jitter or spurs in a clock tracking circuit that compares an output clock (or a feedback signal representative of an output clock signal) to a reference clock. Duty cycle distortion is a difference between the duty of a clock signal and an ideal duty cycle, which ideal duty cycle may be 50%. Duty cycle mismatch is a difference between respective duty cycles of oscillating signals (e.g., clock signals) that are compared at least in terms of phase or frequency. Some clock tracking circuits individually correct the duty cycle distortion present in the reference clock, output clock, or both, and assume it will correct duty cycle mismatch between a reference clock and an output clock. However, the inventors of this disclosure appreciate that when the results of correcting duty-cycle distortion individually in two clock signals are combined, e.g., that of the reference clock and that of the output clock, errors incurred during the respective duty-cycle distortion correction processes may be additive—increasing overall error.

The inventors of this disclosure appreciate that duty cycle mismatch correction that utilizes both clock signals would be desirable, as a non-limiting example, by avoiding or reducing at least some of undesirable effects of applying separate processes to correct duty-cycle distortion, discussed above.

FIG. 1 is a block diagram depicting an apparatus 100 to track a clock (and may also be referred to herein as a "clock tracking circuit 100"), in accordance with one or more examples. As non-limiting examples, clock tracking circuit 100 may be a hybrid phase locked loop (PLL), analog PLL, a digital PLL, a delay locked loop (DLL), an injection locked loop (ILL), or a frequency synthesizer.

Apparatus 100 includes a phase frequency detector 102, a controller 104, a controlled-oscillator 106, and a duty cycle matching circuit 108. Apparatus 100 operates, generally, to generate an output clock signal 112 phase-locked and frequency-locked to a reference clock signal 110.

Phase frequency detector 102 generates an up/down error signals 116 that includes information about a phase and frequency difference between changed feedback clock signal 120 ("CHANGED FB CLK 122") and reference clock signal 110. Up/down error signals 116 includes two signals, an UP signal and a DOWN signal, as discussed, below. Phase frequency detector 102 is edge triggered, and resets upon detecting an edge of reference clock signal 110 and an edge of changed feedback clock signal 120. Phase frequency detector 102 does not distinguish between rising or falling edges. As non-limiting examples, phase frequency detector 102 may be or include one or more of a phase-frequency detector, a bang-bang phase detector, or a subsampling phase detector.

Up/down error signals 116 includes direction information and magnitude information. Such direction information indicates if changed feedback clock signal 120 is lagging in phase or leading in phase with respect to reference clock signal 110. Such magnitude information of up/down error signals 116 indicates an extent to which changed feedback clock signal 120 lags in phase or leads in phase with respect to reference clock signal 110.

Changed feedback clock signal 120 matches feedback clock signal 114 in terms of phase and frequency, and feedback clock signal 114 is indicative of phase and frequency of output clock signal 112, so, up/down error signals 116 may be utilized to determine phase and frequency information about changed feedback clock signal 120, feedback clock signal 114, output clock signal 112, reference clock signal 110, and differences there between. Up/down error signals 116 may also be utilized to determine pulse width and duty cycle information about changed feedback clock signal 120, feedback clock signal 114, output clock signal 112, reference clock signal 110, and differences there between, as discussed below. Up/down error signals 116 is provided directly to an input of duty cycle matching circuit 108.

Reference clock signal 110 may be generated by any suitable clock source for a given operational context. Feedback clock signal 114 may be the same as output clock signal 112 (e.g., output clock signal 112 is provided directly to an input of duty cycle matching circuit 108, without limitation) or may be a clock signal indicative of the phase, frequency, pulse width, and duty cycle of output clock signal 112. For example, the phase, frequency, pulse width, and duty cycle of feedback clock signal 114 may be the same or different than output clock signal 112, but in either case, is relatable back to the phase, frequency, pulse width, and duty cycle of output clock signal 112. As a non-limiting example, the feedback clock signal 114 may be a frequency divided version of output clock signal 112 (frequency divider/buffer not depicted).

Controlled-oscillator 106 is an electronic oscillator for generating output clock signal 112 at least partially in response to control signal 118, which control signal 118 may be a digital control signal (i.e., in the case of a digital controlled oscillator (DCO)), a voltage control signal (i.e., in the case of a voltage controlled oscillator (VCO)), a current control signal (i.e., in the case of a current controlled oscillator (CCO)) or a combination thereof (i.e., a hybrid controlled oscillator (e.g., any combination of digital, voltage, or current controlled, without limitation)).

In the specific non-limiting example depicted by FIG. 1, apparatus 100 includes a controller 104 to provide control signal 118, at least partially in response to up/down error signals 116, to controlled-oscillator 106 to adjust output clock signal 112. Controller 104 may include circuits (analog circuits, digital circuits, or both) to provide proportional control and integral control of controlled-oscillator 106. Controller 104 may include a proportional control path for transient correction of phase differences between feedback clock signal 114 and reference clock signal 110 indicated by up/down error signals 116. Controller 104 may include an integral control path to urge an average frequency of controlled-oscillator 106 toward a target frequency (e.g., a frequency of reference clock signal 110 or a multiple thereof, without limitation) in response to frequency differences between feedback clock signal 114 and reference clock signal 110 indicated by up/down error signals 116.

The lock detect signal 122 indicates whether or not there is dual-edge lock by apparatus 100. When lock detect signal 122 indicates dual-edge lock, apparatus 100 will have naturally aligned the center of a pulse of changed feedback clock signal 120 with a center of a pulse of reference clock signal 110. If a duty cycle of changed feedback clock signal 120 matches a duty cycle of reference clock signal 110, the rising and falling edges of changed feedback clock signal 120 will be aligned to rising and falling edges of reference clock signal 110, if a duty cycle of changed feedback clock signal 120 does not match a duty cycle reference clock signal 110, the delta between the rising edges and falling edges of changed feedback clock signal 120 and the rising and falling edges of reference clock signal 110 will be substantially the same because the center of respective pulses are aligned by apparatus 100—as in the examples depicted by FIG. 4A and FIG. 4B, discussed below.

In one or more examples, lock detect signal 122 is provided to duty cycle matching circuit 108 to indicate the conditions for duty cycle matching and reducing duty cycle mismatch between changed feedback clock signal 120 and reference clock signal 110, as discussed below.

Duty cycle matching circuit 108 generates changed feedback clock signal 120 at least partially responsive to feedback clock signal 114 and up/down error signals 116. Changed feedback clock signal 120 is provided to phase frequency detector 102 for comparison with reference clock signal 110. Duty cycle matching circuit 108 may generate changed feedback clock signal 120 having a duty cycle that more closely matches a duty cycle of reference clock signal 110 than a duty cycle of feedback clock signal 114. Stated another way, changed feedback clock signal 120 and reference clock signal 110 may exhibit reduced duty cycle mismatch than feedback clock signal 114 and reference clock signal 110. Reduced duty cycle mismatch may reduce jitter or spurs exhibited by apparatus 100.

Figure 2:
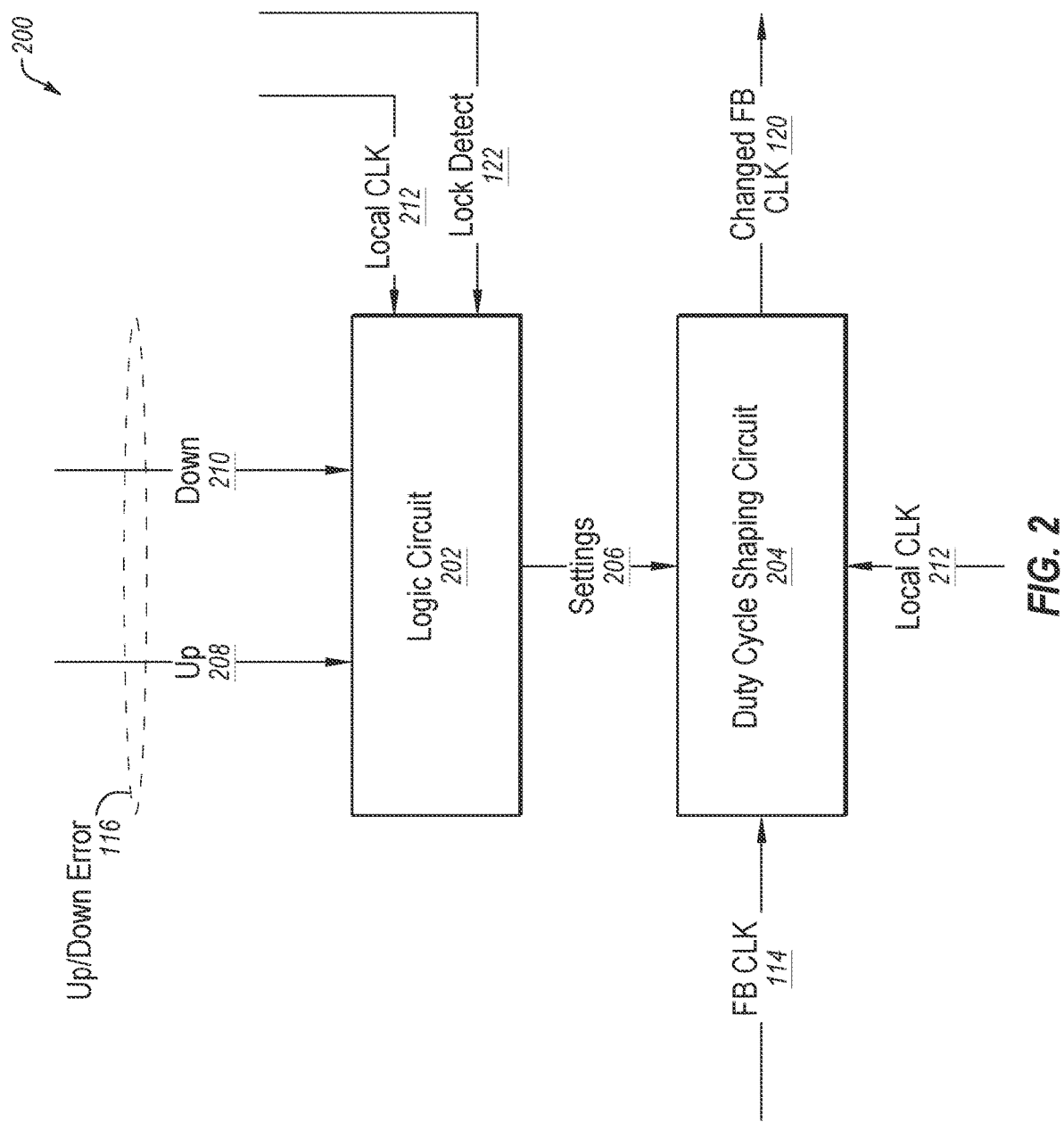
FIG. 2 is a block diagram of an apparatus to match duty cycles of clocks, in accordance with one or more examples.

FIG. 2 is a block diagram of an apparatus 200 to match duty cycles of clocks, in accordance with one or more examples. Apparatus 200 is a non-limiting example of duty cycle matching circuit 108 of FIG. 1.

Apparatus 200 generates a changed feedback clock signal 120 having a changed pulse width and duty cycle as compared to feedback clock signal 114. The pulse width and duty cycle of changed feedback clock signal 120 are set at apparatus 200 as discussed below to reduce duty cycle mismatch between changed feedback clock signal 120 and reference clock signal 110, as compared to duty cycle mismatch between feedback clock signal 114 and reference clock signal 110. In this manner, when changed feedback clock signal 120 is provided in lieu of feedback clock signal 114, apparatus 200 may be understood to reduce duty cycle mismatch between feedback clock signal 114 and reference clock signal 110.

Changing a duty cycle of a clock (e.g., changed feedback clock signal 120, without limitation) may be referred to herein as "calibrating a duty cycle of a clock," and a process to perform the same referred to herein as a "calibration process." In one or more examples, a calibration process may include multiple calibration cycles, and during at least some of the calibration cycles a duty cycle of changed feedback clock signal 120 may be incrementally set, as discussed below.

The number of calibration cycles implemented is a matter of design choice and may be set, as a non-limiting example, based on specific operating conditions. In one or more examples, a number of calibration cycles may be variable, as a non-limiting example, when a given calibration process executes until duty cycle mismatch is below a predetermined threshold. In one or more examples, a number of calibration cycles may be variable up to a predetermined upper limit (e.g., count calibration cycles and exit when a value of count is greater than a predetermined upper limit, without limitation). In one or more examples, a number of calibration cycles may be variable with a predetermined lower limit (e.g., count calibration cycles, at least the lower limit number of calibration cycles are executed before determining duty cycle mismatch is below a predetermined threshold, without limitation).

Apparatus 200 includes logic circuit 202 and duty cycle shaping circuit 204. In one or more examples, logic circuit 202 and duty cycle shaping circuit 204 may be synchronized with each other via local clock signal 212. In one or more examples, local clock signal 212 may be responsive to reference clock signal 110 (e.g., a delayed version of reference clock signal 110, without limitation). Calibration cycles may be synchronized to clock cycles of local clock signal 212.

Logic circuit 202 receives lock detect signal 122, UP signal 208, and DOWN signal 210 (respectively of up/down error signals 116 generated by phase frequency detector 102), determines if either UP signal 208 or DOWN signal 210 is ahead in phase of the other signal, and generates settings 206 at least partially responsive to the determination.

As discussed above, when lock detect signal 122 indicates dual-edge lock, apparatus 100 will have naturally aligned the center of a pulse of changed feedback clock signal 120 with a center of a pulse of reference clock signal 110. If UP signal 208 is ahead in phase of DOWN signal 210, then a pulse width of changed feedback clock signal 120 is wider than a pulse width of reference clock signal 110 and there is a duty cycle mismatch. If DOWN signal 210 is ahead in phase of UP signal 208, then a pulse width of changed feedback clock signal 120 is skinnier than a pulse width of reference clock signal 110 there is a duty cycle mismatch.

Accordingly, when lock detect signal 122 indicates dual edge lock, logic circuit 202 may detect duty cycle mismatch between changed feedback clock signal 120 and reference clock signal 110 at least partially responsive to an order (e.g., a time order, without limitation) according to which pulses on UP signal 208 or DOWN signal 210 are received. Further, when lock detect signal 122 indicates dual edge lock, logic circuit 202 may determine whether a pulse width of changed feedback clock signal 120 is skinnier or wider than a pulse width of reference clock signal 110, and generate settings 206 to instruct duty cycle shaping circuit 204 to lengthen or shorten a pulse width of changed feedback clock signal 120.

In one or more examples, logic circuit 202 may instruct duty cycle shaping circuit 204 to lengthen or shorten a pulse width of changed feedback clock signal 120 by a predetermined amount over one or more calibration cycles of a calibration process. Over multiple calibration cycles, a duty cycle of lock detect signal 122 will change as the pulse width changes, and duty cycle mismatch between changed feedback clock signal 120 and reference clock signal 110 may be reduced.

duty cycle shaping circuit 204 is arranged in a signal path of feedback clock signal 114 and generates changed feedback clock signal 120 at least partially responsive to feedback clock signal 114 and settings 206 generated by logic circuit 202.

Changed feedback clock signal 120 is provided to phase frequency detector 102 (e.g., in lieu of feedback clock signal 114). During a given calibration process, as the pulse width and duty cycle of changed feedback clock signal 120 changes, up/down error signals 116 generated by phase frequency detector 102 may change, a the changes in up/down error signals 116 are received at apparatus 200 and may be utilized to optionally further change a pulse width and duty cycle of changed feedback clock signal 120. By the end of given calibration process, duty cycle mismatch between changed feedback clock signal 120 and feedback clock signal 114 is reduced.

In one or more examples, a calibration process may execute until a duty cycle of changed feedback clock signal 120 matches a duty cycle of reference clock signal 110. Alternatively, in one or more examples a calibration process may execute for only a predetermined number of calibration cycles and then end. While the calibration process executes, a duty cycle of changed feedback clock signal 120 may change to be generally more like a duty cycle of reference clock signal 110, though respective duty cycles may not necessarily match at the end of the calibration process. Stated another way, while the calibration process executes, a mismatch between respective duty cycles of changed feedback clock signal 120 and reference clock signal 110 may decrease, though not be completely eliminated.

Figure 3:
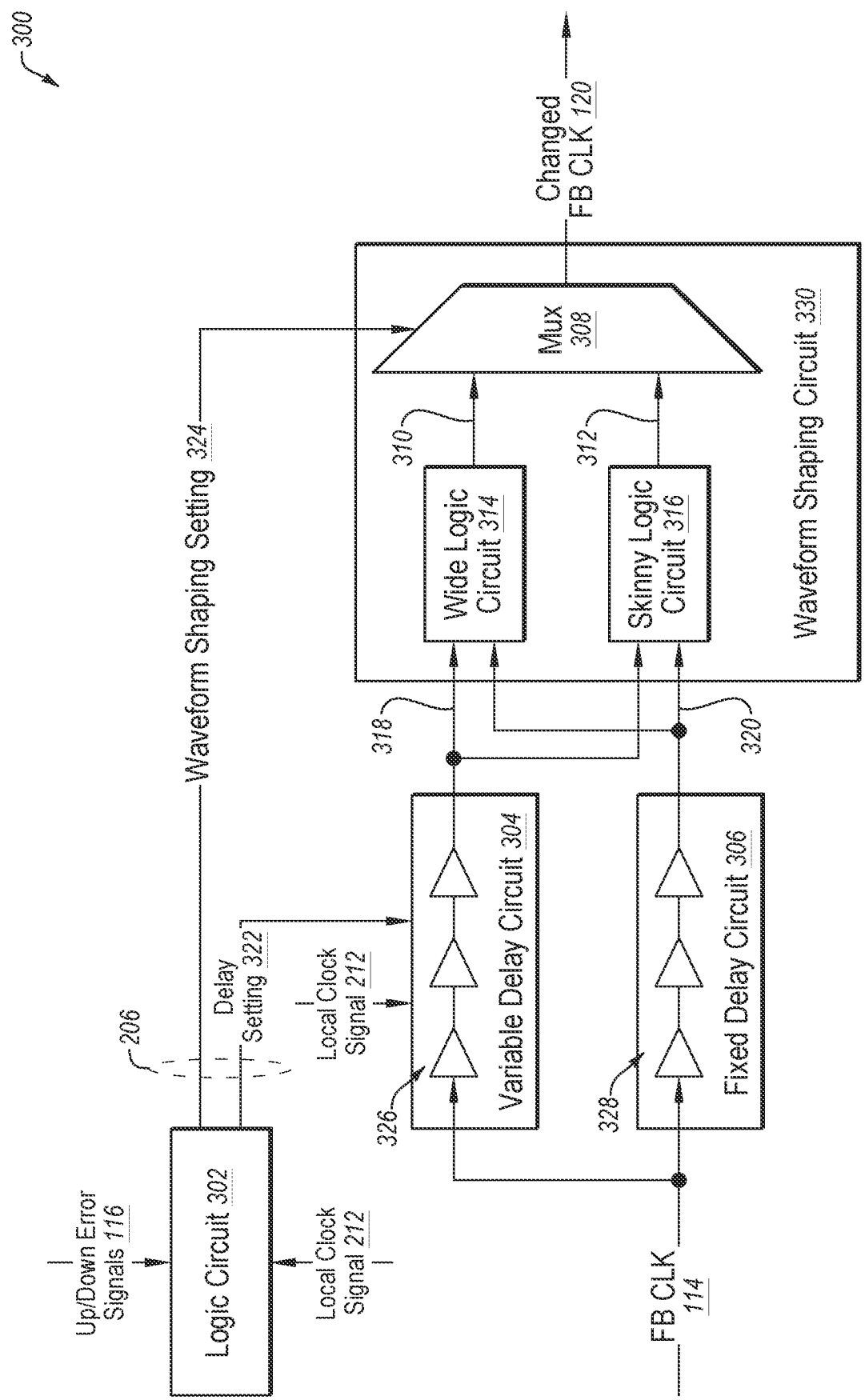
FIG. 3 is a block diagram depicting an apparatus to generate a changed feedback clock.

FIG. 3 is a block diagram depicting an apparatus 300 to generate a changed feedback clock, and more specifically, a changed feedback clock signal 120 having a changed duty cycle compared to a duty cycle of feedback clock signal 114, and more specifically still, a changed feedback clock signal 120 having a changed pulse width compared to a pulse width of feedback clock signal 114, in accordance with one or more examples. Apparatus 300 is a non-limiting example of a portion of a portion of apparatus 200 that includes logic circuit 202 and duty cycle shaping circuit 204 of FIG. 2.

Apparatus 300 includes a logic circuit 302, variable delay circuit 304, a fixed delay circuit 306, and a waveform shaping circuit 330. Waveform shaping circuit 330 includes a wide logic circuit 314, a skinny logic circuit 316, and a multiplexer 308. Logic circuit 302 is a non-limiting example of logic circuit 202 of FIG. 2. Variable delay circuit 304, fixed delay circuit 306, and waveform shaping circuit 330 together are a non-limiting example of a duty cycle shaping circuit 204 of FIG. 2. Logic circuit 302 receives binary error signals 116 (here, UP/DOWN error signals 116) and local clock signal 212 as described above. Logic circuit 302 may also receive lock detect signal 122, but lock detect signal 122 is omitted in FIG. 3 simply for ease of discussion and to avoid unnecessarily obscuring the figure.

Variable delay circuit 304 and fixed delay circuit 306 generate first delayed clock signal 318 and second delayed clock signal 320, which are the waveform shaping signals utilized by waveform shaping circuit 330 to shape a waveform of changed feedback clock signal 120, as discussed, below.

Variable delay circuit 304 receives local clock signal 212, delay setting 322 and feedback clock signal 114, and generates first delayed clock signal 318 at least partially responsive to delay setting 322 and feedback clock signal 114. A respective delay implemented by variable delay circuit 304 corresponds to delay setting 322 generated by logic circuit 302, which logic circuit 302 generates delay setting 322 at least partially responsive to binary error signals 116.

Fixed delay circuit 306 receives feedback clock signal 114 and generates second delayed clock signal 320 at least partially responsive to feedback clock signal 114. Fixed delay circuit 306 implements a fixed delay. In one or more examples, a delay implemented by fixed delay circuit 306 may be hard wired or coded, or fixed delay circuit 306 may be a variable delay circuit set by a control signal (e.g., generated by logic circuit 302 or a further logic circuit that is not depicted, without limitation) that indicates a substantially constant delay. In one or more examples, a delay implemented by fixed delay circuit 306 corresponds to an internal delay of apparatus 300.

In one or more examples, variable delay circuit 304 and fixed delay circuit 306 may internally implement any suitable technique to generate first delayed clock signal 318 and second delayed clock signal 320, respectively, based on feedback clock signal 114. A non-limiting example of a suitable technique may include enabling a number of buffers or inverters in a signal path to increase delay and disabling a number of buffers or inverters in the signal path to decrease delay.

In one or more examples, variable delay circuit 304 or fixed delay circuit 306 may respectively include delay cells 326/delay cells 328 to implement respective delays. In one or more examples, delay cells 326/delay cells 328 may utilize any suitable technique to implement delay. By way of non-limiting example, delay cells 326/delay cells 328 may be or include logic gates or devices (e.g., inverters, buffers, without limitation) that enable cascaded connection of a variable number of such gates or devices. By way of another non-limiting example, delay cells 326/delay cells 328 may be or include circuits, such as resistor-capacitor circuits where a variable number of resistors are selectively coupled in parallel. Delay exhibited by a resistor-capacitor circuit is a function of the time constant of the circuit, and is inversely proportional to the number of resistors selectively coupled in parallel.

First delayed clock signal 318 and second delayed clock signal 320 are both provided to waveform shaping circuit 330, and wide logic circuit 314 and skinny logic circuit 316, more specifically. Generally, waveform shaping circuit 330 performs waveform shaping as discussed below, e.g., waveform shaping circuit 330 generate changed feedback clock signal 120 with a changed pulse width and, accordingly, a changed duty cycle.

Wide logic circuit 314 and skinny logic circuit 316 respectively provide waveform shaping functions of waveform shaping circuit 330. Wide logic circuit 314 shortens wide pulses (e.g., generates first changed clock signal 310 with a waveform having a shorter pulse width than feedback clock signal 114, and therefore a lower duty cycle than first delayed clock signal 318, which first delayed clock signal 318 has the same pulse width and duty cycle as feedback clock signal 114), and skinny logic circuit 316 widens short pulses (e.g., generates second changed clock signal 312 with a waveform having a wider pulse width than feedback clock signal 114, and therefore a greater duty cycle than second delayed clock signal 320, which second delayed clock signal 320 has the same pulse width and duty cycle as feedback clock signal 114), as discussed below. Here, "wide" refers to a pulse width of changed feedback clock signal 120 being longer than a desired pulse width, and "skinny" refers to a pulse width of changed feedback clock signal 120 being shorter than a desired pulse width. As used herein, a "desired duty cycle" is a duty cycle of reference clock signal 110, and a "desired pulse width" is a pulse width of reference clock signal 110.

Multiplexer 308 selects one of first changed clock signal 310 or second changed clock signal 312 at least partially responsive to waveform shaping setting 324 generated by logic circuit 302. In this manner, waveform shaping setting 324 sets a waveform shaping function of waveform shaping circuit 330.

Logic circuit 302 generates delay setting 322 and waveform shaping setting 324 to reduce duty cycle mismatch between feedback clock signal 114 and reference clock signal 110 as indicated by binary error signals 116. The internal logic of logic circuit 302 is discussed above, with respect to logic circuit 202, and below, with reference to FIG. 4A, FIG. 4B, FIG. 5A, and FIG. 5B, and not repeated, here.

In one or more examples, settings 206 include waveform shaping setting 324 and delay setting 322.

The first delayed clock signal 318 differs in phase from second delayed clock signal 320 by an amount that corresponds to a delay implemented at variable delay circuit 304 in response to delay setting 322. Waveform shaping circuit 330, and more specifically, wide logic circuit 314 and skinny logic circuit 316, as may be selected by waveform shaping setting 324, utilize the amount of phase difference to set a pulse width and duty cycle of first changed clock signal 310 and second changed clock signal 312, and multiplexer 308 selects one of first changed clock signal 310 and second changed clock signal 312 to provide as changed feedback clock signal 120, and thus set a pulse width and duty cycle of changed feedback clock signal 120.

In one or more examples, a delay amount by which variable delay circuit 304 is incremented or decremented may be fixed per calibration cycle to a predetermined amount (also referred to herein as a "delay step size"). For a given calibration cycle, the predetermined delay amount may be less than a total difference between a pulse width of changed feedback clock signal 120 and a desired pulse width (or a pulse width of feedback clock signal 114 and reference clock signal 110). Apparatus 300 may execute multiple calibration cycles to generate a changed feedback clock signal 120 having desired pulse width or a changed feedback clock signal 120 having a pulse width exhibiting reduced duty cycle mismatch to the duty cycle of reference clock signal 110. Operation of logic circuit 302 and variable delay circuit 304 may be synchronized by local clock signal 212, and respective calibration cycles may correspond to clock cycles of local clock signal 212.

In various examples, a total number of calibration cycles may be limited to a predetermined number (a predetermined upper limit) and, in some cases, a pulse width of changed feedback clock signal 120 that results from a calibration process may, or may not, substantially match a pulse width of reference clock signal 110.

For a given calibration cycle, if binary error signals 116 indicate a duty cycle of changed feedback clock signal 120 is greater than a duty cycle of reference clock signal 110, logic circuit 302 generates delay setting 322 and waveform shaping setting 324 to shorten a pulse width of changed feedback clock signal 120 by a predetermined amount. If binary error signals 116 indicate a duty cycle of changed feedback clock signal 120 is less than a duty cycle of reference clock signal 110, logic circuit 302 generates delay setting 322 and waveform shaping setting 324 to lengthen a pulse width of changed feedback clock signal 120 by a predetermined amount.

If logic circuit 302 determines, at least partially based on binary error signals 116, that a pulse width of second delayed clock signal 320 is skinnier than a desired pulse width, logic circuit 302 generates waveform shaping setting 324 to select second changed clock signal 312 input at multiplexer 308. If logic circuit 302 determines, at least partially based on binary error signals 116, that a pulse width of second delayed clock signal 320 is wider than a desired pulse width, logic circuit 302 generates waveform shaping setting 324 to select first changed clock signal 310 input at multiplexer 308.

Figure 4A:
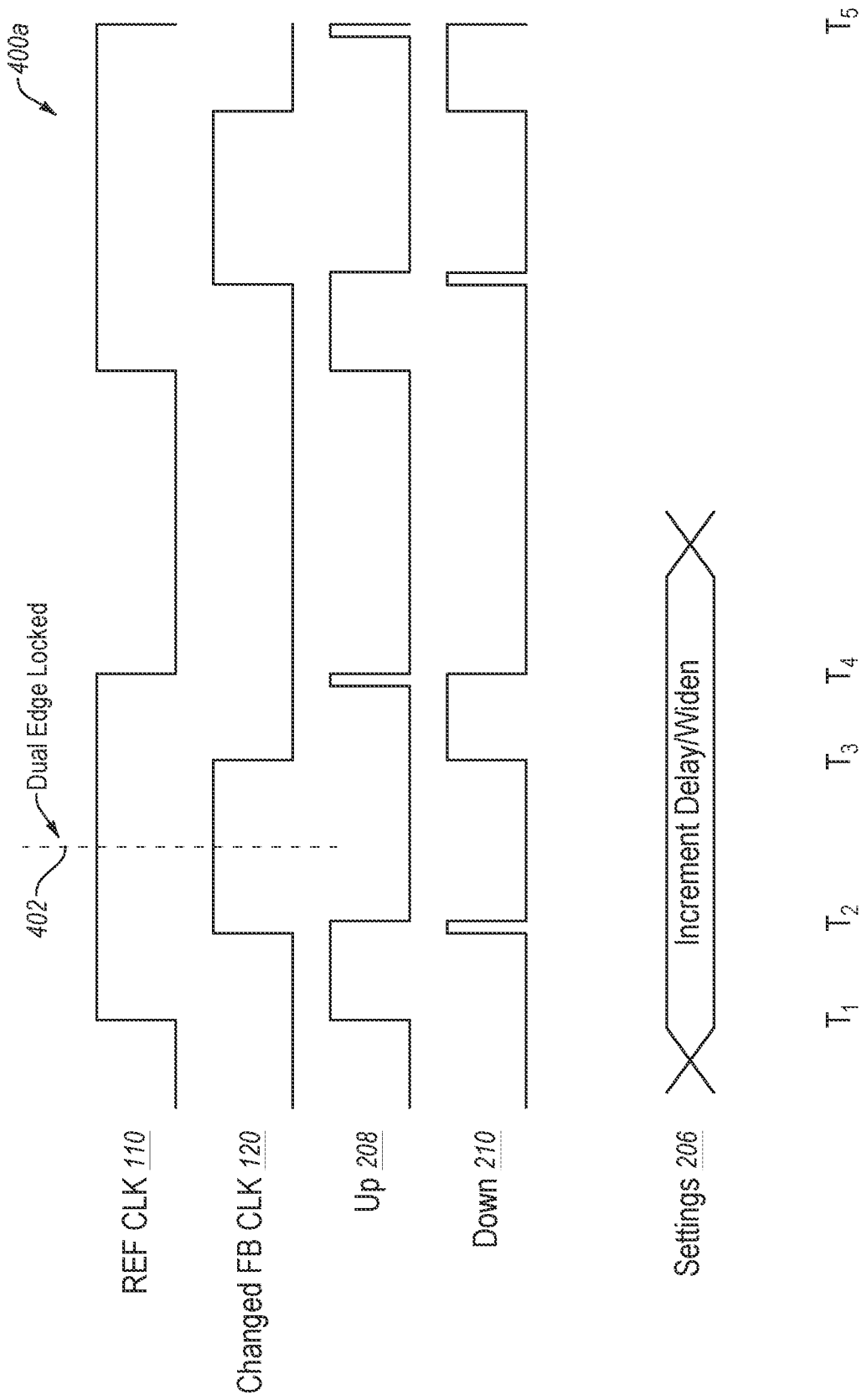
FIG. 4A is a timing diagram depicting signals in an example generation of settings, and more specifically, delay setting and waveform shaping setting, in a case where up/down error signals indicates a duty cycle mismatch between changed feedback clock signal and reference clock signal, and a pulse width of changed feedback clock signal being skinnier than a pulse width of reference clock signal.

FIG. 4A is a timing diagram depicting signals 400a in an example generation of settings 206, and more specifically, delay setting 322 and waveform shaping setting 324, in a case where up/down error signals 116 indicates a duty cycle mismatch between changed feedback clock signal 120 and reference clock signal 110, and a pulse width of changed feedback clock signal 120 being skinnier than a pulse width of reference clock signal 110.

Signals 400a include reference clock signal 110, changed feedback clock signal 120, UP signal 208, and DOWN signal 210. Notably, vertical line 402 is depicted extending through respective center points of pulses of reference clock signal 110 and changed feedback clock signal 120 to illustrate the alignment of respective pulses when reference clock signal 110 and changed feedback clock signal 120 are dual-edge locked.

At time $T_1$, phase frequency detector 102 asserts UP signal 208 and de-asserts DOWN signal 210 to indicate an edge of reference clock signal 110 (here, a rising edge) is ahead in phase of an edge of changed feedback clock signal 120.

At time $T_1$, logic circuit 202 detects a duty cycle mismatch between reference clock signal 110 and changed feedback clock signal 120 at least partially responsive to assertion of UP signal 208 ahead in phase of DOWN signal 210. Logic circuit 202 determines that a pulse width of changed feedback clock signal 120 is skinnier than a pulse width of reference clock signal 110 at least partially responsive to assertion of UP signal 208 ahead in phase of DOWN signal 210, which indicates an edge of reference clock signal 110 ahead in phase of an edge of DOWN signal 210. At least partially based on the determinations, logic circuit 202 generates settings 206 to instruct duty cycle shaping circuit 204 to lengthen a pulse width of changed feedback clock signal 120. More specifically, logic circuit 202 may generate settings 206 to include delay setting 322 to indicate "increment delay" at variable delay circuit 304 by a predetermined amount, and to include waveform shaping setting 324 to instruct waveform shaping circuit 330 to "widen" a pulse width of changed feedback clock signal 120.

At time $T_2$, phase frequency detector 102 asserts DOWN signal 210 to indicate an edge of changed feedback clock signal 120 (here, a rising edge) and resets, which de-asserts UP signal 208 and DOWN signal 210.

At time $T_3$, phase frequency detector 102 asserts DOWN signal 210 and continues to de-assert UP signal 208 to indicate an edge of changed feedback clock signal 120 (here, a falling edge) is ahead in phase of an edge of reference clock signal 110.

Notably, at time $T_3$, logic circuit 202 does not respond to assertion of DOWN signal 210 because, at time $T_1$, logic circuit 202 detected the duty cycle mismatch between reference clock signal 110 and changed feedback clock signal 120, and determined settings 206. In one or more examples, logic circuit 202 may optionally confirm the detected duty cycle mismatch between reference clock signal 110 and changed feedback clock signal 120 at time $T_3$.

At time $T_4$, phase frequency detector 102 asserts UP signal 208 to indicate an edge of reference clock signal 110 (here, a falling edge) and resets, which de-asserts UP signal 208 and DOWN signal 210.

The time duration $T_1$ to $T_2$ or from $T_3$ to $T_4$ substantially corresponds to one-half (½) of the difference in pulse width between changed feedback clock signal 120 and reference clock signal 110 due to dual-edge lock between reference clock signal 110 and changed feedback clock signal 120 by apparatus 100.

Although FIG. 4A depicts settings 206 transmitted between times $T_1$ and $T_4$, settings 206 may be transmitted later than time $T_4$ without exceeding the scope. In one or more examples, duty cycle matching circuit 108 may observe the duty cycles of changed feedback clock signal 120 and reference clock signal 110 and implement a change in changed feedback clock signal 120 discussed herein every N cycles of reference clock signal 110 and changed feedback clock signal 120, where N is an integer greater or equal to 2. In cases where N is greater than or equal to 2, settings 206 may be transmitted in a later cycle than the cycle in which duty cycles are observed, but prior to the next cycle in which duty cycles are observed.

Figure 4B:
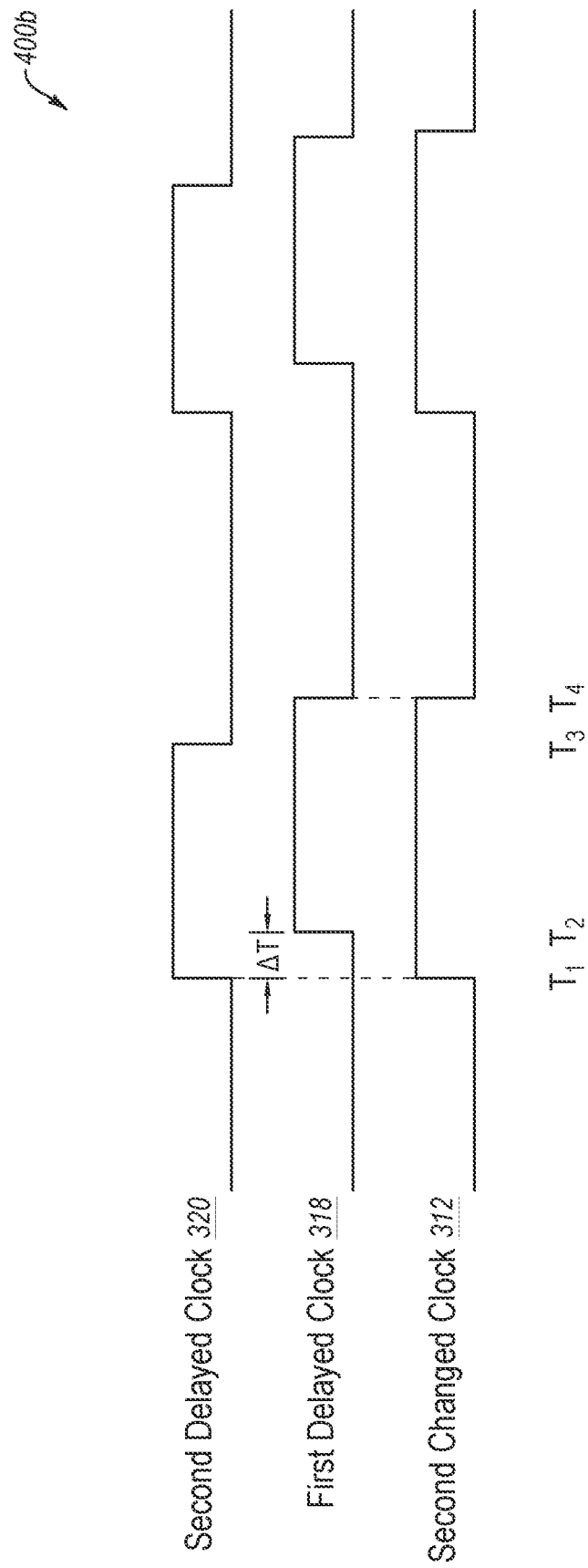
FIG. 4B is a timing diagram depicting signals in an example generation of second changed clock signal in a case where up/down error signals indicates a duty cycle mismatch between changed feedback clock signal and reference clock signal, and a pulse width of changed feedback clock signal being skinnier than a pulse width of reference clock signal, as depicted in FIG. 4A.

FIG. 4B is a timing diagram depicting signals 400b in an example generation of second changed clock signal 312 in a case where up/down error signals 116 indicates a duty cycle mismatch between changed feedback clock signal 120 and reference clock signal 110, and a pulse width of changed feedback clock signal 120 being skinnier than a pulse width of reference clock signal 110, as depicted in FIG. 4A.

More specifically, logic circuit 302 determines detects a duty cycle mismatch at least partially responsive to an order of assertions of UP signal 208 and DOWN signal 210, as a non-limiting example, as depicted by FIG. 4A. Logic circuit 302 determines that a pulse width of changed feedback clock signal 120 is skinnier than a pulse width of reference clock signal 110 at least partially responsive to the order of assertions of UP signal 208 and DOWN signal 210. In response to the determinations, logic circuit 302 generates delay setting 322 to indicate incrementing a delay amount at variable delay circuit 304 and generates waveform shaping setting 324 to instruct waveform shaping circuit 330 to utilize a pulse width widening waveform shaping function, i.e., skinny logic circuit 316.

Signals 400b include second delayed clock signal 320, first delayed clock signal 318 and second changed clock signal 312 in an example operation of wide logic circuit 314. In the following example, skinny logic circuit 316 operates as, or is, an OR-gate.

At time $T_1$, second delayed clock signal 320 exhibits a change from a first state to a second, different, state, here a rising edge, while first delayed clock signal 318 remains in a first state. At time $T_1$, skinny logic circuit 316 generates second changed clock signal 312 exhibiting a change from a first state to a second state because at least one of second delayed clock signal 320 and first delayed clock signal 318 is in the first state.

At time $T_2$, first delayed clock signal 318 exhibits a change from a first state to a second state, a rising edge. A time duration $\Delta T$ from time $T_1$ to time $T_2$ is substantially equal to one or more delay increments, discussed above. Time duration $\Delta T$ may correspond to one or more delay increments of variable delay circuit 304.

Due to delay setting 322, a rising edge of first delayed clock signal 318 is "behind" (in terms of time) a rising edge of second delayed clock signal 320. At time $T_2$, skinny logic circuit 316 maintains second changed clock signal 312 in the second state because at least one of second delayed clock signal 320 and first delayed clock signal 318 is in the second state.

At time $T_3$, second delayed clock signal 320 exhibits a change from a second state to a first state, here a falling edge, while first delayed clock signal 318 remains in a second state. At time $T_3$, skinny logic circuit 316 maintains second changed clock signal 312 in a second state because at least one of second delayed clock signal 320 and first delayed clock signal 318 is in the second state.

At time $T_4$, first delayed clock signal 318 exhibits a change from a second state to a first state, here a falling edge. At time $T_4$, skinny logic circuit 316 generates a falling edge for second changed clock signal 312, i.e., second changed clock signal 312 changes from the second state to the first state, because neither one of second delayed clock signal 320 and first delayed clock signal 318 are in the second state.

The time duration between times $T_1$ and $T_4$, i.e., the pulse width of second changed clock signal 312, is longer than the time duration between $T_1$ and $T_3$, i.e., the pulse width of second delayed clock signal 320.

Figure 5A:
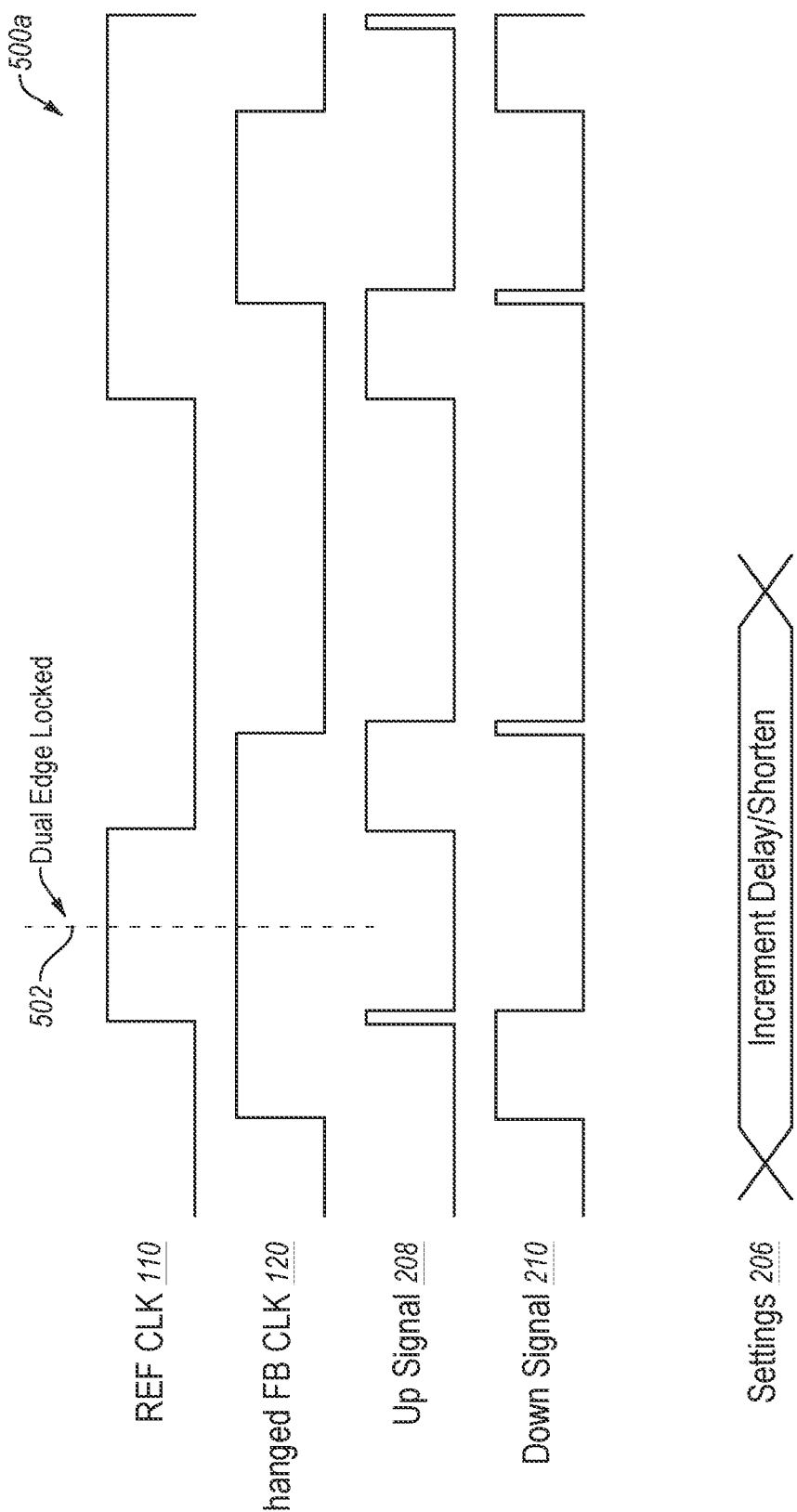
FIG. 5A is a timing diagram depicting signals in an example generation of settings, and more specifically, delay setting and waveform shaping setting, in a case where up/down error signals indicates a duty cycle mismatch between changed feedback clock signal and reference clock signal, and a pulse width of changed feedback clock signal being wider than a pulse width of reference clock signal.

FIG. 5A is a timing diagram depicting signals 400a in an example generation of settings 206, and more specifically, delay setting 322 and waveform shaping setting 324, in a case where up/down error signals 116 indicates a duty cycle mismatch between changed feedback clock signal 120 and reference clock signal 110, and a pulse width of changed feedback clock signal 120 being wider than a pulse width of reference clock signal 110.

Figure 5B:
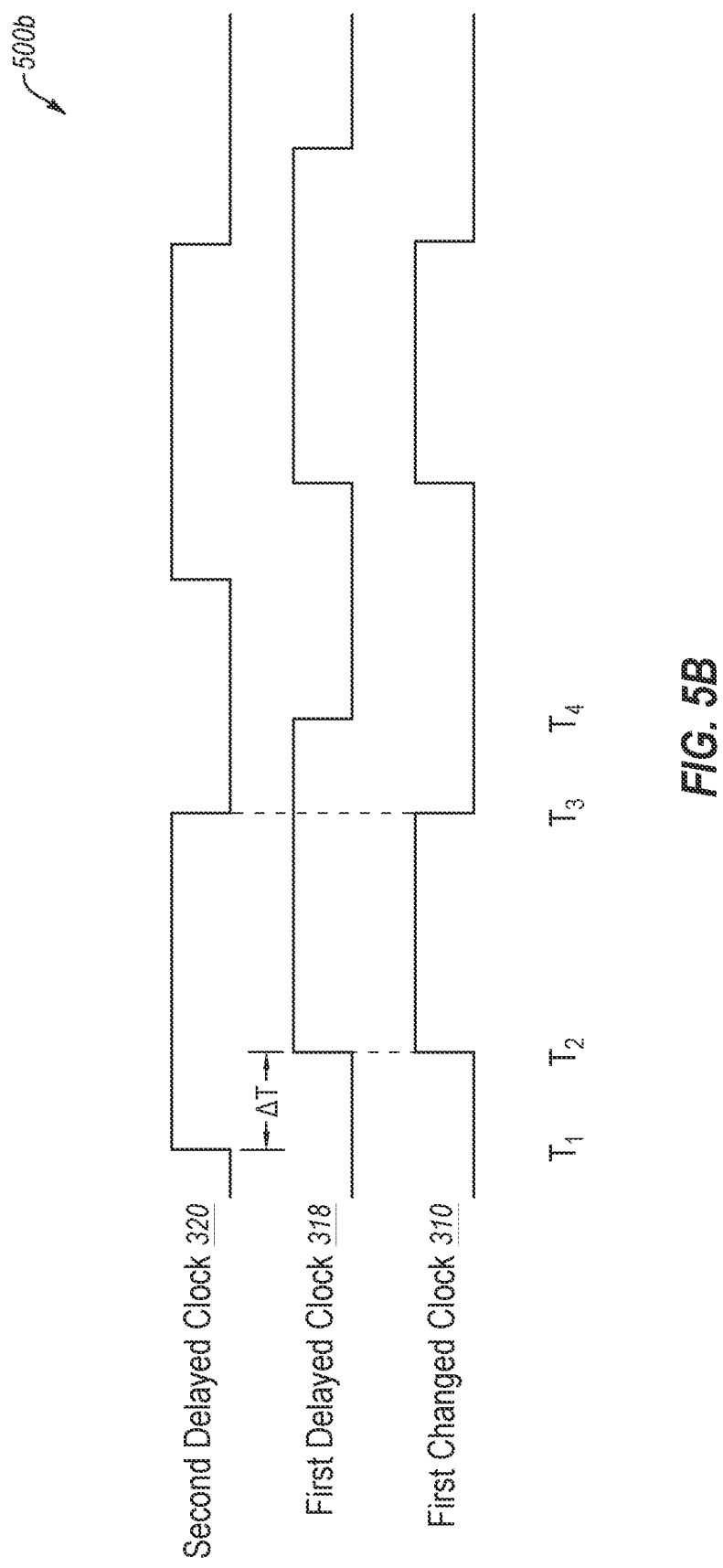
FIG. 5B is a timing diagram depicting signals in an example generation of first changed clock signal in a case where up/down error signals indicates a duty cycle mismatch between changed feedback clock signal and reference clock signal, and a pulse width of changed feedback clock signal being wider than a pulse width reference clock signal, as depicted in FIG. 5A.

FIG. 5B is a timing diagram depicting signals 500b in an example generation of a changed feedback clock signal 120 that has a shorter pulse width than changed feedback clock signal 120.

Signals 500a include reference clock signal 110, changed feedback clock signal 120, UP signal 208 and DOWN signal 210. Notably, vertical line 502 is depicted extending through respective center points of pulses of reference clock signal 110 and changed feedback clock signal 120 to illustrate the alignment of respective pulses when reference clock signal 110 and changed feedback clock signal 120 are dual-edge locked.

At time $T_1$, phase frequency detector 102 asserts DOWN signal 210 and continues to de-assert UP signal 208 to indicate an edge of changed feedback clock signal 120 (here, a rising edge) is ahead in phase of an edge of reference clock signal 110.

At time $T_1$, logic circuit 202 detects a duty cycle mismatch between reference clock signal 110 and changed feedback clock signal 120 at least partially responsive to assertion of DOWN signal 210 ahead in phase of UP signal 208. Logic circuit 202 determines that a pulse width of changed feedback clock signal 120 is wider than a pulse width of reference clock signal 110 at least partially responsive to assertion of UP signal 208 ahead in phase of DOWN signal 210, which indicates an edge of changed feedback clock signal 120 was ahead in phase of an edge of reference clock signal 110. At least partially based on the determinations, logic circuit 202 generates settings 206 to instruct duty cycle shaping circuit 204 to shorten a pulse width of changed feedback clock signal 120. More specifically, logic circuit 202 may generate settings 206 to include delay setting 322 to indicate "increment delay" at variable delay circuit 304 by a predetermined amount, and to include waveform shaping setting 324 to instruct waveform shaping circuit 330 to "shorten" a pulse width of changed feedback clock signal 120.

At time T$_2$, phase frequency detector 102 asserts UP signal 208 to indicate an edge of reference clock signal 110 (here, a rising edge) and resets, which de-asserts UP signal 208 and DOWN signal 210.

At time T$_3$, phase frequency detector 102 asserts UP signal 208 and continues to de-assert DOWN signal 210 to indicate an edge of reference clock signal 110 (here, a falling edge) is ahead in phase of an edge of changed feedback clock signal 120.

Notably, at time T$_3$, logic circuit 202 does not respond to assertion of UP signal 208 because, at time T$_1$, logic circuit 202 detected the duty cycle mismatch between reference clock signal 110 and changed feedback clock signal 120, and determined settings 206. In one or more examples, logic circuit 202 may optionally confirm the detected duty cycle mismatch between reference clock signal 110 and changed feedback clock signal 120 at time T$_3$.

At time T$_4$, phase frequency detector 102 asserts DOWN signal 210 to indicate an edge of changed feedback clock signal 120 (here, a falling edge) and resets, which de-asserts UP signal 208 and DOWN signal 210.

The time durations from T$_1$ to T$_2$ and from T$_3$ to T$_4$ substantially correspond to one-half (½) of the difference in pulse width between changed feedback clock signal 120 and reference clock signal 110 due to dual-edge lock between reference clock signal 110 and changed feedback clock signal 120 by apparatus 100.

Although FIG. 5A depicts settings 206 transmitted between times T$_1$ and T$_4$, settings 206 may be transmitted later than time T$_4$ without exceeding the scope. In one or more examples, duty cycle matching circuit 108 may observe the duty cycles of changed feedback clock signal 120 and reference clock signal 110 and implement a change in changed feedback clock signal 120 discussed herein every N cycles of reference clock signal 110 and changed feedback clock signal 120, where N is an integer greater or equal to 2. In cases where N is greater than or equal to 2, settings 206 may be transmitted in a later cycle than the cycle in which duty cycles are observed, but prior to the next cycle in which duty cycles are observed.

FIG. 5B is a timing diagram depicting signals 500b in an example generation of first changed clock signal 310 in a case where up/down error signals 116 indicates a duty cycle mismatch between changed feedback clock signal 120 and reference clock signal 110, and a pulse width of changed feedback clock signal 120 being wider than a pulse width reference clock signal 110, as depicted in FIG. 5A.

More specifically, logic circuit 302 determines detects a duty cycle mismatch at least partially responsive to an order of assertions of UP signal 208 and DOWN signal 210, as a non-limiting example, as depicted by FIG. 5A. Logic circuit 302 determines that a pulse width of changed feedback clock signal 120 is wider than a pulse width of reference clock signal 110 at least partially responsive to the order of assertions of UP signal 208 and DOWN signal 210. In response to the determinations, logic circuit 302 generates delay setting 322 to indicate incrementing a delay amount at variable delay circuit 304 and generates waveform shaping setting 324 to instruct waveform shaping circuit 330 to utilize a pulse width shortening waveform shaping function, i.e., wide logic circuit 314.

Signals 500b include second delayed clock signal 320, first delayed clock signal 318 and first changed clock signal 310. In the following examples, wide logic circuit 314 operates as, or is, an AND-gate.

At time T$_1$, second delayed clock signal 320 exhibits a change a change from a first state to a second, different, state, here a rising edge, while first delayed clock signal 318 remains in a first state. Because second delayed clock signal 320 and first delayed clock signal 318 exhibit different states, wide logic circuit 314 continues to generate first changed clock signal 310 exhibiting the first state.

At time T$_2$, first delayed clock signal 318 exhibits a change from the first state to the second state (a rising edge), while second delayed clock signal 320 remains in the second state, so wide logic circuit 314 generates first changed clock signal 310 exhibiting a change from a first state to a second state because both of second delayed clock signal 320 and first delayed clock signal 318 are in the second state.

Notably, the time duration ΔT between time T$_1$ and time T$_2$ may substantially equal one or more delay increments implemented by variable delay circuit 304, discussed above.

At time T$_3$, second delayed clock signal 320 exhibits a change from the second state to the first state (falling edge), while first delayed clock signal 318 remains in the second state, so wide logic circuit 314 generates first changed clock signal 310 exhibiting a falling edge from the second state to the first state because at least one of second delayed clock signal 320 and first delayed clock signal 318 is in the first state.

At time T$_4$, first delayed clock signal 318 exhibits a falling edge from the second state to the first state, while second delayed clock signal 320 remains in the first state, so wide logic circuit 314 generates second changed clock signal 312 exhibiting a falling edge from the second state to the first state because both second delayed clock signal 320 and first delayed clock signal 318 are in the first state. Because second delayed clock signal 320 and first delayed clock signal 318 exhibit the first state, wide logic circuit 314 continues to generate second changed clock signal 312 exhibiting the first state.

The time duration between times T$_2$ and T$_3$ (i.e., the pulse width of first changed clock signal 310) is shorter than the pulse width of either first delayed clock signal 318 or second delayed clock signal 320.

Figure 6:
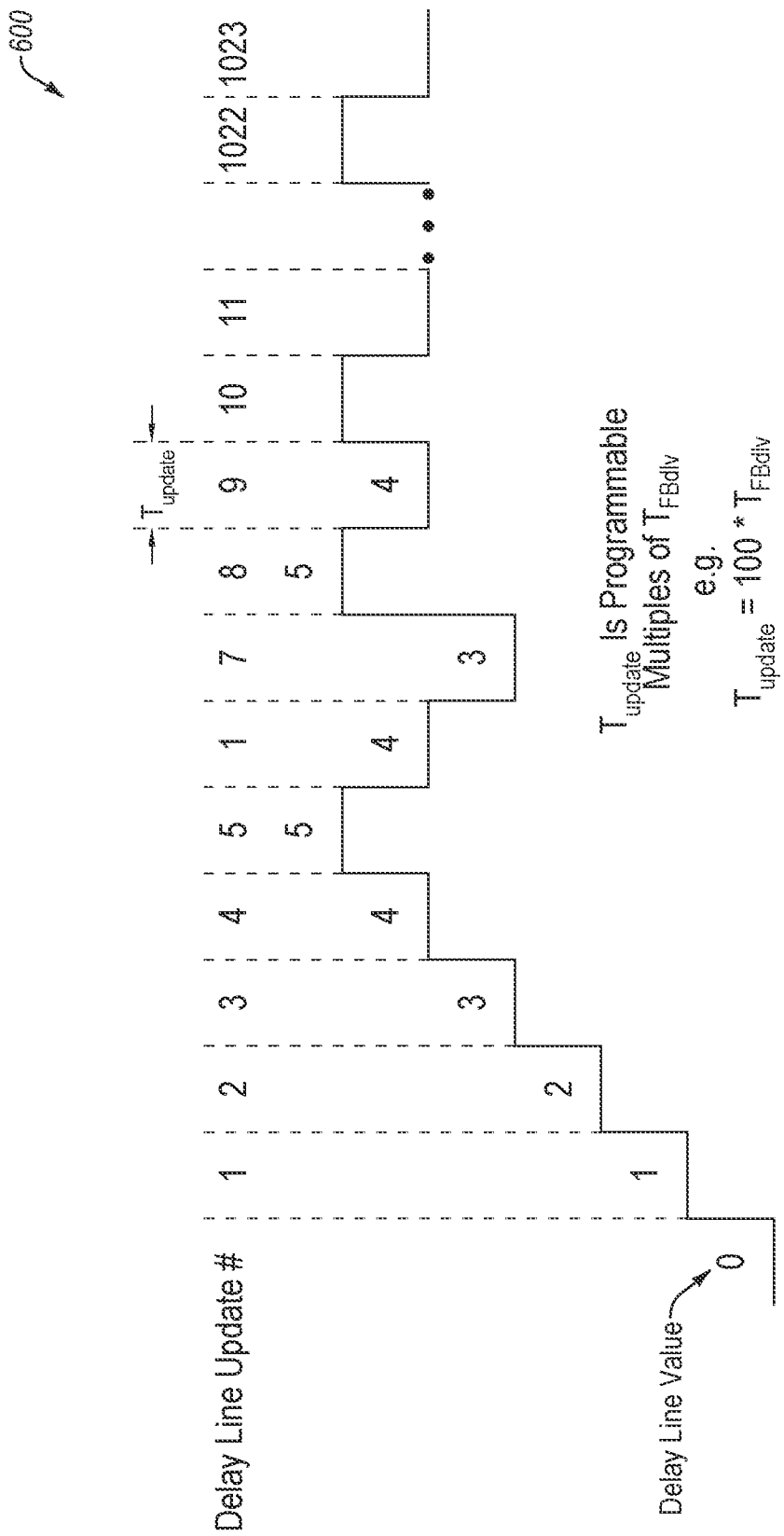
FIG. 6 is a diagram depicting a calibration process in accordance with one or more examples.

FIG. 6 is a diagram depicting a calibration process 600 in accordance with one or more examples. Depicted are delay line update numbers ("Delay Line update #") which identify a sequence of respective calibration cycles of a calibration process 600. Also depicted are respective delay values ("Delay Line Value") applied during the respective calibration cycles. Each delay line value represents a multiple of a predetermined delay amount. For example, "1" represents 1× the predetermined delay amount, "2" represents 2× the predetermined delay amount, and so on and so forth.

In the specific example depicted by FIG. 6, respective delay values increment from delay line update number 0 to delay line update number 5, decrement from delay line update number 5 to delay line update number 7, and increment from delay line update number 7 to delay line update number 8. From delay line update number 8 to 1023, the delay line update number toggles between incrementing and decrementing, which indicates duty cycles are matched for purposes of calibration process 600.

Figure 7:
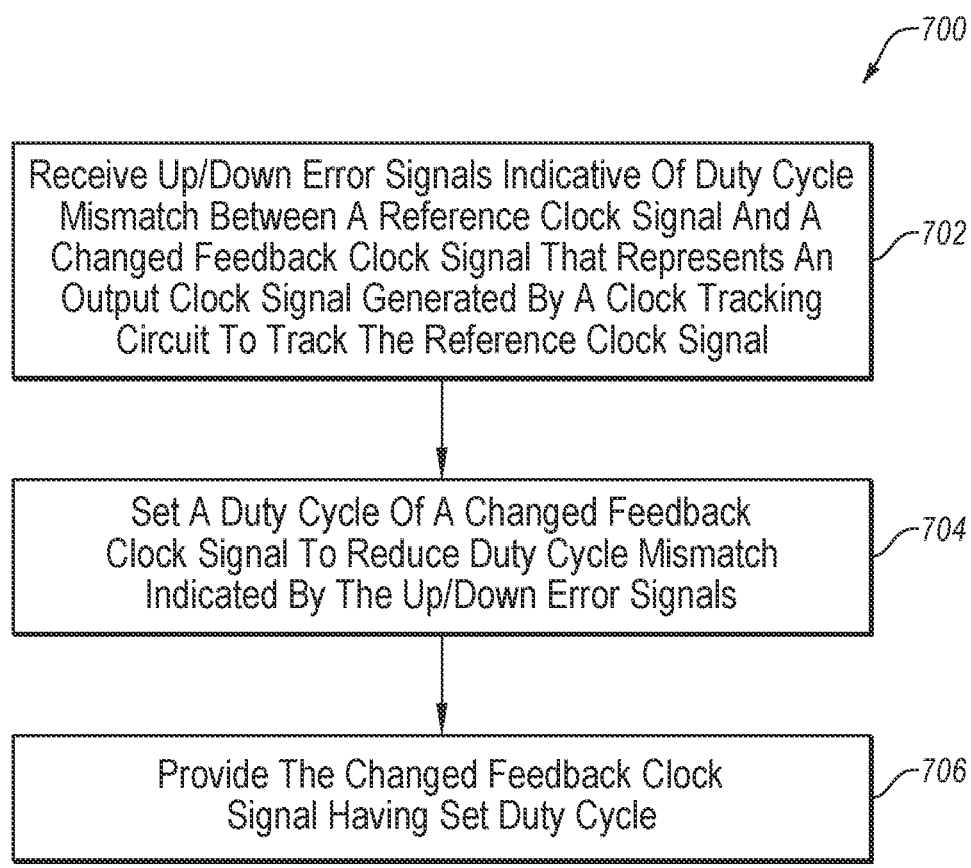
FIG. 7 is a flow diagram depicting a process to change a duty cycle of a clock to match the duty cycle of a further clock.

FIG. 7 is a flow diagram depicting a process 700 to change a duty cycle of a clock to match the duty cycle of a further clock, where the clock may be output clock signal 112, feedback clock signal 114, or changed feedback clock signal 120, and the further clock may be reference clock signal 110, in accordance with one or more examples.

Some or a totality of process 700 may be performed by duty cycle matching circuit 108, apparatus 200, apparatus 300, or apparatus 1100, without limitation.

Although FIG. 7 depicts process 700 as a particular sequence of operations, the sequence may be altered without departing from the scope of the present disclosure. In one or more examples, some of the operations depicted may be performed in parallel or in a different sequence that does not materially affect the function of process 700. In one or more examples, different components of an apparatus or system implementing some or a totality of operations of process 700 may perform functions at substantially the same time or in a specific sequence.

At operation 702, process 700 receives an up/down error signals (e.g., up/down error signals 116 generated via phase frequency detector 102, without limitation) indicative of duty cycle mismatch between a reference clock (e.g., reference clock signal 110, without limitation) and a changed feedback clock (e.g., changed feedback clock signal 120, without limitation) that represents an output clock generated by a clock tracking circuit (e.g., clock tracking circuit 100, without limitation) to track the reference clock.

At operation 704, process 700 sets (e.g., via settings 206 provided to duty cycle shaping circuit 204, without limitation) a duty cycle of the changed feedback clock to reduce duty cycle mismatch indicated by the up/down error signals.

In one or more examples, process 700 may set a duty cycle of the changed clock via a calibration process that includes multiple calibration cycles. Duty cycle mismatch may be incrementally reduced via process 700 at least partially responsive to respective calibration cycles.

At operation 706, process 700 provides the changed feedback clock having a set duty cycle. In one or more examples, process 700 provides the changed feedback clock having the set duty cycle to a phase frequency detector (e.g., phase frequency detector 102) in lieu of an output clock (or a feedback clock representative thereof) generated by a clock tracking circuit.

Figure 8:
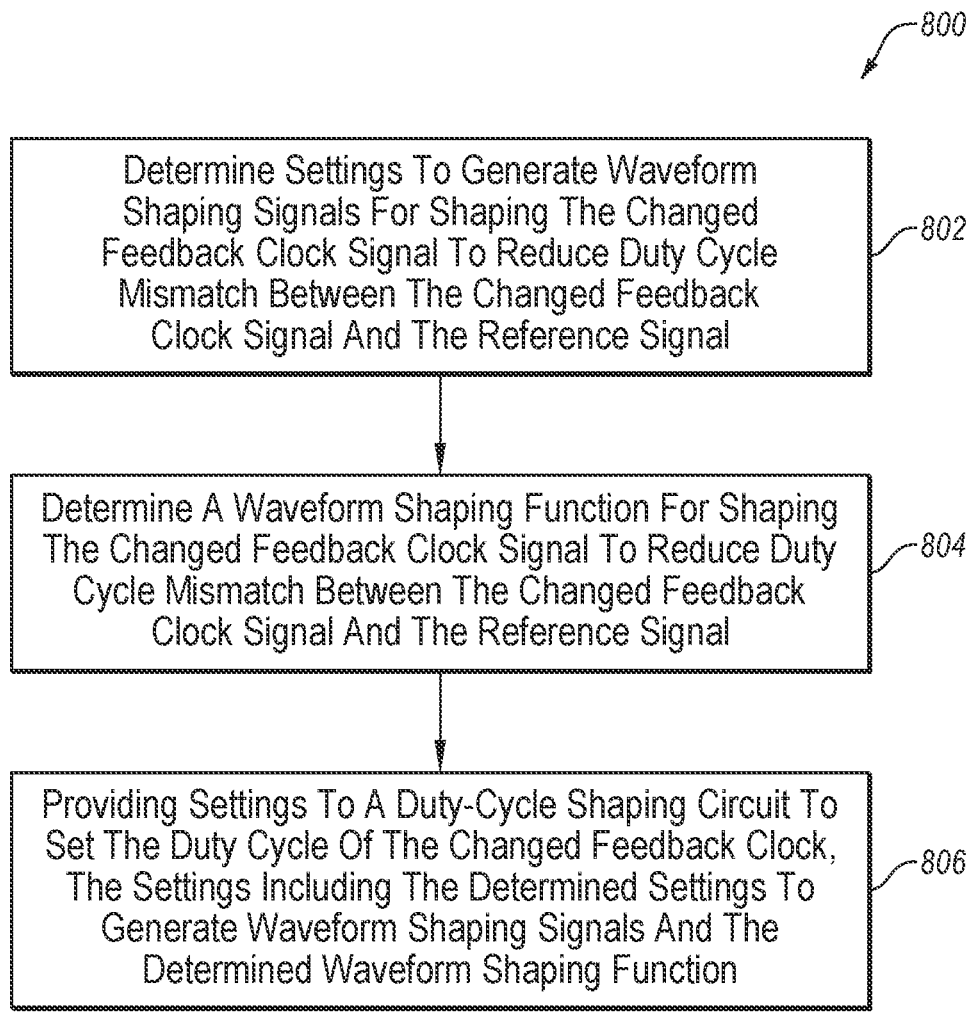
FIG. 8 is a flow diagram depicting a process to set a duty cycle of a changed feedback clock signal to reduce duty cycle mismatch indicated by the up/down error signals.

FIG. 8 is a flow diagram depicting a process 800 to set a duty cycle of a changed feedback clock signal to reduce duty cycle mismatch indicated by the up/down error signals.

Although FIG. 8 depicts process 800 in a particular sequence of operations, the sequence may be altered without departing from the scope of the present disclosure. For example, some of the operations depicted may be performed in parallel or in a different sequence that does not materially affect the function of process 800. In other examples, different components of an example device or system that implements the routine may perform functions at substantially the same time or in a specific sequence.

At operation 802, process 800 determines settings to generate waveform shaping signals for shaping the changed feedback clock signal to reduce duty cycle mismatch indicated by the up/down error signals. In one or more examples, the waveform shaping signals for shaping the changed feedback clock signal may be the first delayed clock signal 318 generated by variable delay circuit 304, second delayed clock signal 320 generated by fixed delay circuit 306, first delayed clock 1114 generated by variable delay circuit 1104, or second delayed clock 1116 generated by fixed delay circuit 1106.

At operation 804, process 800 determines a waveform shaping function for shaping the changed feedback clock signal to reduce duty cycle mismatch indicated by the up/down error signals. In one or more examples, the waveform shaping functions may include lengthening a pulse width (e.g., via skinny logic circuit 316 or waveform shaping circuit 1112, without limitation), or shortening a pulse width (e.g., via wide logic circuit 314 or waveform shaping circuit 1112, without limitation).

At operation 806, process 800 provides settings to a duty-cycle shaping circuit to set the duty cycle of the changed feedback clock, the settings including the determined settings to generate waveform shaping signals and the determined waveform shaping function. In one or more examples, process 800 may provide the settings to generate waveform shaping signals for shaping the changed feedback clock signal to a variable delay circuit (e.g., variable delay circuit 304 or variable delay circuit 1104, without limitation), and provide the settings for the determined waveform shaping function to a waveform shaping circuit (e.g., waveform shaping circuit 330, without limitation).

In one or more examples, process 800 may determine settings to generate waveform shaping signals or for a waveform shaping function at least partially responsive to an order in which up/down error signals are received, where the order indicates duty cycle mismatch and whether or the changed feedback clock signal is skinnier or wider than the reference clock signal.

Figure 9:
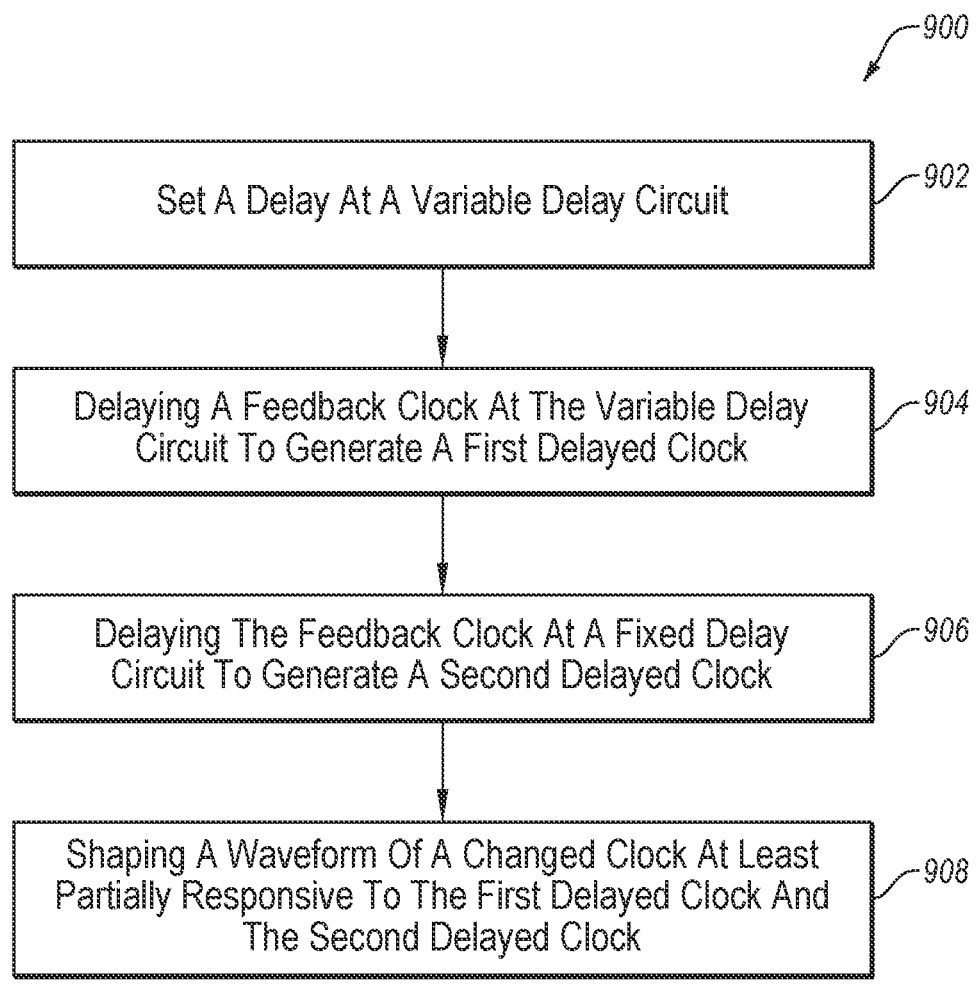
FIG. 9 is a flow diagram depicting a process to shape a waveform of changed feedback clock, in accordance with one or more examples.

FIG. 9 is a flow diagram depicting a process 900 to shape a waveform of changed feedback clock, in accordance with one or more examples. Some or a totality of operations of process 900 may be performed by duty cycle shaping circuit 204, variable delay circuit 304, variable delay circuit 1104, fixed delay circuit 306, fixed delay circuits 1106, waveform shaping circuit 330, or waveform shaping circuit 1112.

Although FIG. 9 depicts process 900 in a particular sequence of operations, the sequence may be altered without departing from the scope of the present disclosure. For example, some of the operations depicted may be performed in parallel or in a different sequence that does not materially affect the function of process 900. In other examples, different components of an example device or system that implements the routine may perform functions at substantially the same time or in a specific sequence.

At operation 902, process 900 sets (e.g., via delay setting 322 generated by logic circuit 302 or via delay setting 1122 generated by logic circuit 1102, discussed below, without limitation) a delay at a variable delay circuit (e.g., variable delay circuit 304 or variable delay circuit 1104, without limitation).

At operation 904, process 900 delays the feedback clock at the variable delay circuit to generate a first delayed clock (e.g., first delayed clock signal 318, without limitation). The delay implemented by the variable delay circuit to delay the reference clock or output clock and generate the first delayed clock signal 318 has been increased or decreased by the amount of delay by which the variable delay circuit was incremented or decremented in operation 902.

At operation 906, process 900 delays the feedback clock at a fixed delay circuit (e.g., fixed delay circuit 306, without limitation) to generate a second delayed clock (e.g., second delayed clock signal 320, without limitation).

At operation 908, process 900 shapes a waveform of a changed feedback clock at least partially responsive to the first delayed clock and the second delayed clock. Waveform shaping may be performed at least partially responsive to the binary up/down error signal and the binary down/up error signal and a determination of whether to shorten or lengthen a pulse width, and accordingly a duty cycle, of the changed feedback clock.

Figure 10:
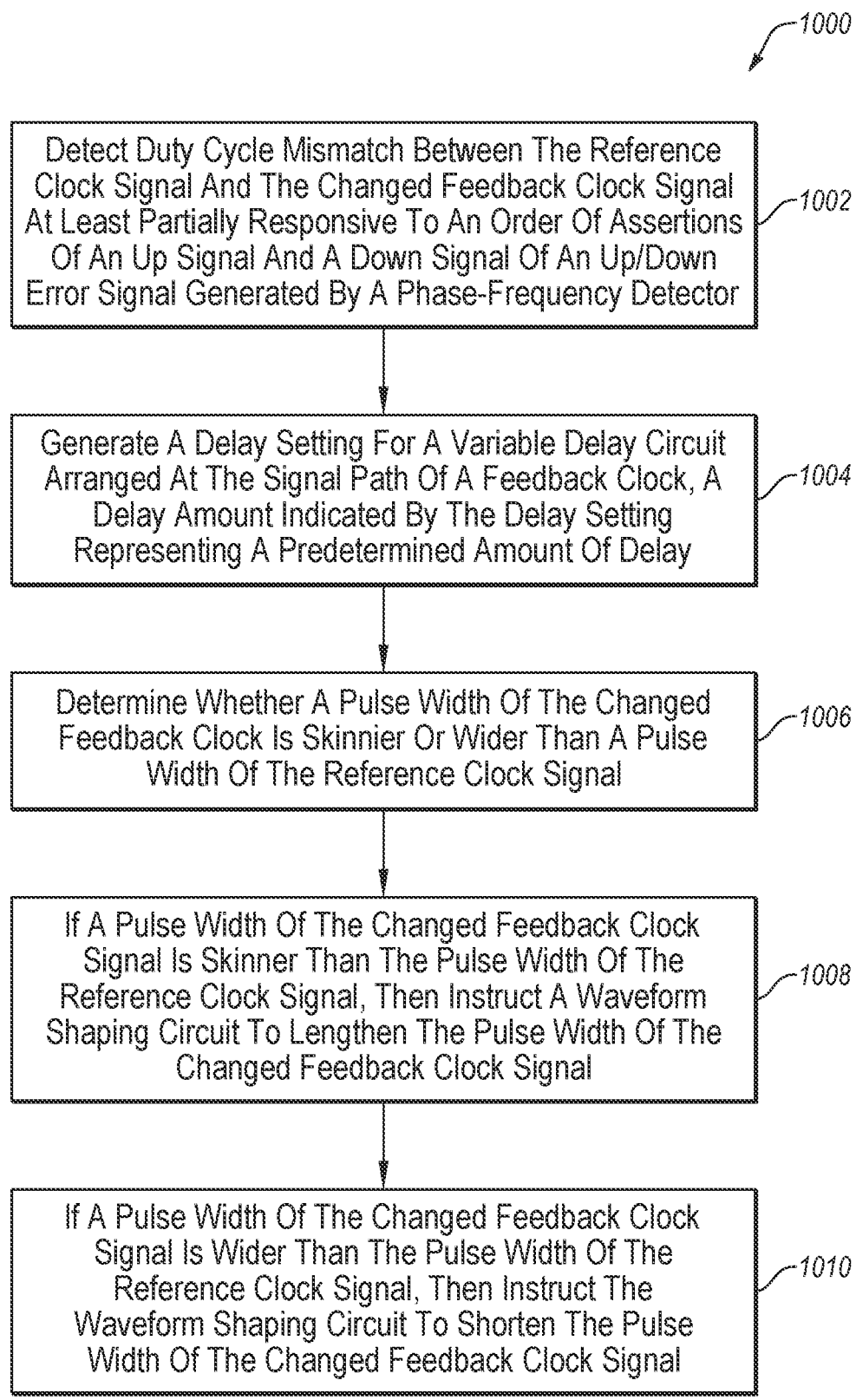
FIG. 10 is a flow diagram depicting a process to generate settings for a duty-cycle shaping circuit.

FIG. 10 is a flow diagram depicting a process 1000 to generate settings for a duty-cycle shaping circuit, such as duty cycle shaping circuit 204, and more specifically, to generate delay settings and waveform shaping settings for a variable delay circuit and a waveform shaping circuit, such as variable delay circuit 304 and waveform shaping circuit 330, or variable delay circuit 1104 and waveform shaping circuit 1112, in accordance with one or more examples.

Some or a totality of operations of process 700 may be performed by logic circuit 202, logic circuit 302, or logic circuit 1102, without limitation.

Although FIG. 10 depicts process 1000 in a particular sequence of operations, the sequence may be altered without departing from the scope of the present disclosure. For example, some of the operations depicted may be performed in parallel or in a different sequence that does not materially affect the function of process 900. In other examples, different components of an example device or system that implements the routine may perform functions at substantially the same time or in a specific sequence.

At operation 1002, process 1000 detects duty cycle mismatch between the reference clock signal and the changed feedback clock signal at least partially responsive to an order of assertions of an UP signal and a DOWN signal of an up/down error signals generated by a phase frequency detector (e.g., up/down error signals 116 generated by phase frequency detector 102, without limitation).

At operation 1004, process 1000 generates a delay setting for a variable delay circuit arranged in a signal path of a feedback clock. The delay indicated by the delay setting may represent a predetermined amount of delay.

At operation 1006, process 1000 determines whether a pulse width of the changed feedback clock is skinnier or wider than a pulse width of the reference clock signal.

At operation 1008, if it is determined that the pulse width of the changed feedback clock signal is skinner than the pulse width of the reference clock signal, process 1000 instructs a waveform shaping circuit to lengthen the pulse width of the changed feedback clock signal.

At optional operation 1010, if it is determined that the pulse width of the changed feedback clock signal is wider than the pulse width of the reference clock signal, then process 1000 instructs the waveform shaping circuit to shorten the pulse width of the changed feedback clock signal.

In one or more examples, the changed feedback clock signal having the lengthened pulse width (e.g., first changed clock signal 310, without limitation) or the shortened pulse width (e.g., second changed clock signal 312, without limitation) is provided (e.g., via multiplexer 308, without limitation) as changed feedback clock signal 120.

Figure 11:
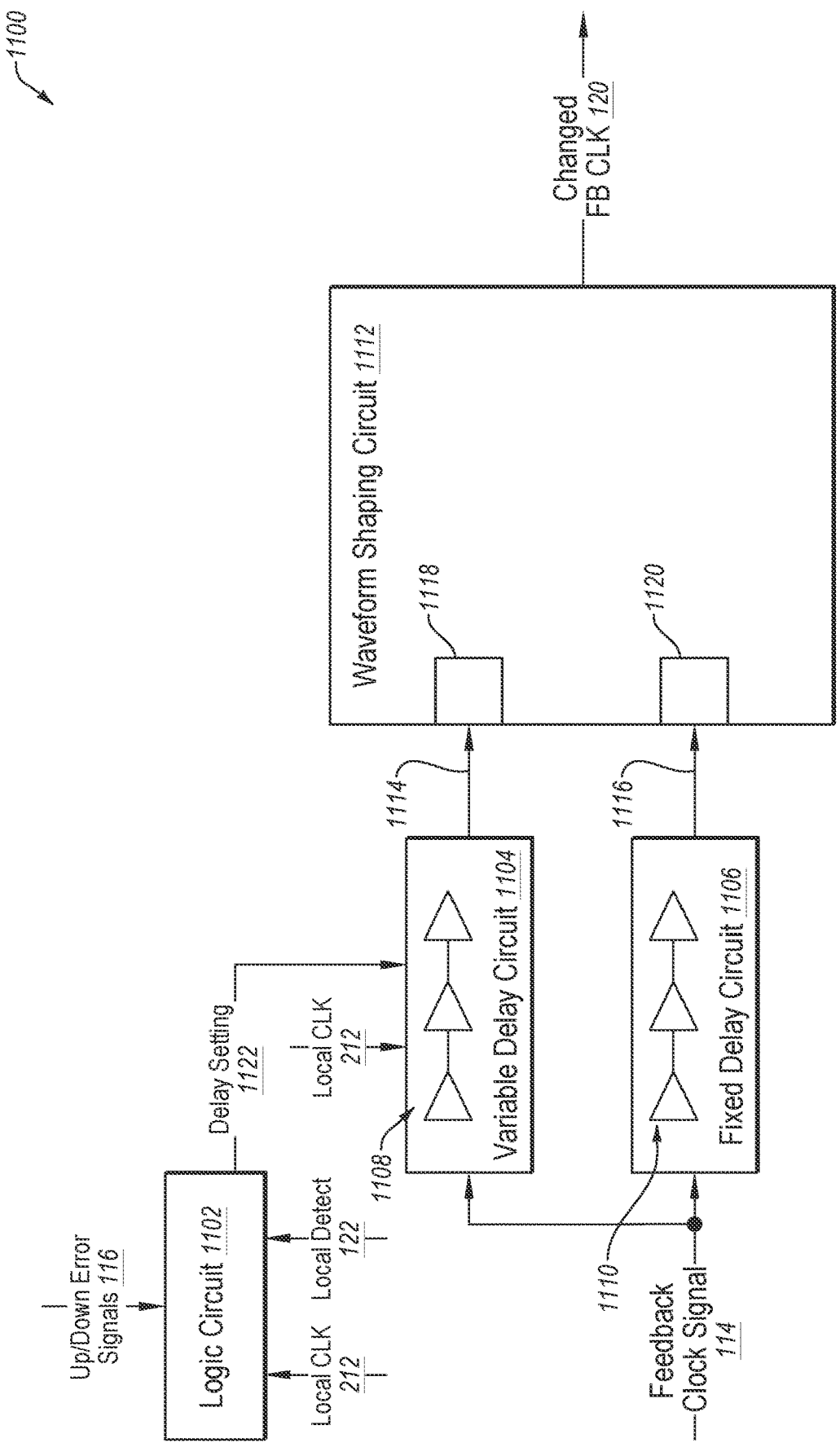
FIG. 11 is a block diagram depicting an apparatus to generate a changed clock.

FIG. 11 is a block diagram depicting an apparatus 1100 to generate a changed clock, and more specifically, a clock having a changed duty cycle compared to a duty cycle of an original clock, and more specifically still, a clock having a changed pulse width compared to a pulse width of the original clock, in accordance with one or more examples.

Apparatus 100 includes logic circuit 1102, variable delay circuit 1104, fixed delay circuit 1106 and waveform shaping circuit 1112. Variable delay circuit 1104, delay cells 1108, fixed delay circuit 1106, and delay cells 1110 are similar to variable delay circuit 304, delay cells 326, fixed delay circuit 306, and delay cells 328, and so are not re-described here. Logic circuit 1102 is a non-limiting example of logic circuit 202 and delay setting 1122 is a non-limiting example of settings 206 or portion thereof. Variable delay circuit 1104, fixed delay circuit 1106, and waveform shaping circuit 1112 are together a non-limiting example of duty cycle shaping circuit 204.

Initially, respective delays at variable delay circuit 1104 and fixed delay circuit 1106 may be set to ½ the delay range of variable delay circuit 1104. Once set at ½ the delay range, the delay amount at variable delay circuit 1104 may be incremented or decremented by one or more delay amounts by logic circuit 1102 utilizing delay setting 1122.

Waveform shaping circuit 1112 generates changed feedback clock signal 120 at least partially responsive to signals received at a first input 1118 and a second input 1120 of waveform shaping circuit 1112. More specifically, waveform shaping circuit 1112 generates changed feedback clock signal 120 exhibiting a change from a first state to a second state (a rising edge) at least partially responsive to a signal received at first input 1118, and generates changed feedback clock signal 120 exhibiting a change from a second state to a first state (a falling edge) at least partially responsive to a signal received at second input 1120. First input 1118 may be characterized as the "rising edge control input" of waveform shaping circuit 1112 and second input 1120 may be characterized as the "falling edge control input" of waveform shaping circuit 1112.

First input 1118 is coupled to an output of variable delay circuit 1104 and second input 1120 is coupled to an output of fixed delay circuit 1106, accordingly, first input 1118 receives first delayed clock 1114 and second input 1120 receives second delayed clock 1116. Logic of waveform shaping circuit 1112 generates first changed clock signal 310 exhibiting a rising edge at least partially responsive to first delayed clock 1114 exhibiting a rising edge, and generates first changed clock signal 310 exhibiting a falling edge at least partially responsive to second delayed clock 1116 exhibiting a falling edge. Waveform shaping circuit 1112 may include, as a non-limiting example, combinational logic circuits to implement generation of first changed clock signal 310 based on first delayed clock 1114 and second delayed clock 1116 as described herein.

If binary error signals 116 indicate a pulse width of changed feedback clock signal 120 is too short (relative to reference clock signal 110), logic circuit 1102 may generate delay setting 1122 to decrement a delay amount at variable delay circuit 1104 and thereby increase a pulse width of first changed clock signal 310.

If binary error signals 116 indicate a pulse width of feedback clock signal 114 is too long (relative to reference clock signal 110), logic circuit 1102 may generate delay setting 1122 to increment a delay amount at waveform shaping circuit 1112 and thereby shorten a pulse width of first changed clock signal 310.

Figure 12A:
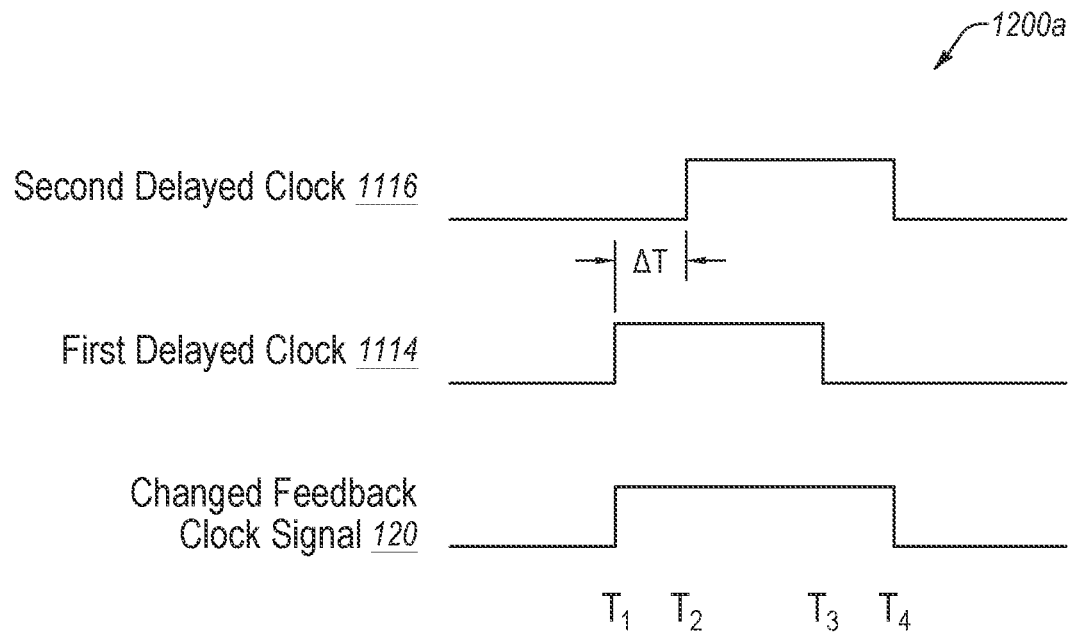
FIG. 12A and FIG. 12B are timing diagrams respectively depicting signals during respective example operations of the apparatus of FIG. 11.
Figure 12B:
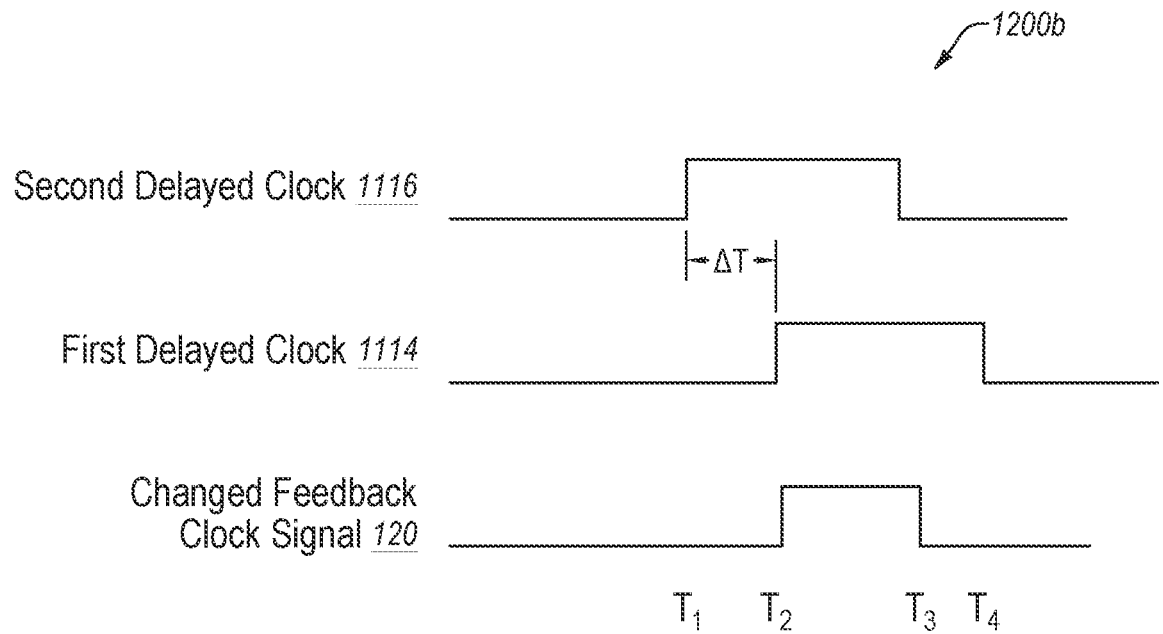

FIG. 12A and FIG. 12B are timing diagrams respectively depicting signals 1200a and signals 1200b during respective example operations of apparatus 1100.

FIG. 12A depicts signals 1200a, including: second delayed clock 1116, first delayed clock 1114, and changed feedback clock signal 120 in an example where a pulse width of feedback clock signal 114 is shorter than a pulse width of reference clock signal 110.

FIG. 12B depicts signals 1200b, including: second delayed clock 1116, first delayed clock 1114, and changed feedback clock signal 120 in an example where a pulse width of feedback clock signal 114 is longer than a desired pulse width of reference clock signal 110.

Turning to an example widening of a short pulse depicted by FIG. 12A:

At time $T_1$, first delayed clock 1114 exhibits a change from a first state to a second, different, state, here, a rising edge. At time $T_1$, waveform shaping circuit 1112 generates changed feedback clock signal 120 exhibiting a change from a first state to a second state at least partially responsive to detecting the change from the first state to the second state (a rising edge) of first delayed clock 1114.

At time $T_1$, second delayed clock 1116 exhibits a change from the first state to the second state, here, a rising edge, but this change of second delayed clock 1116 does not affect changed feedback clock signal 120 generation by waveform shaping circuit 1112 because it is received at second input 1120 of waveform shaping circuit 1112.

At time $T_3$, first delayed clock 1114 exhibits a change from the second state to the first state, here, a falling edge, but this change of second delayed clock 1116 does not affect changed feedback clock signal 120 generation by waveform shaping circuit 1112 because it is received at first input 1118 of waveform shaping circuit 1112.

At time $T_4$, second delayed clock 1116 exhibits a change from the second state to the first state, here, a falling edge. At time $T_4$, waveform shaping circuit 1112 generates changed feedback clock signal 120 exhibiting a change from the second state to the first state at least partially responsive to detecting the change from the first state to the second state (a falling edge) of second delayed clock 1116. Time duration $\Delta T$ in FIG. 12A may substantially equal one or more delay increments implemented by waveform shaping circuit 1112 discussed above.

The time duration from $T_2$ to $T_4$ (pulse width of changed feedback clock signal 120) is longer than the time durations between $T_1$ and $T_3$ (pulse width of first delayed clock 1114) and $T_2$ and $T_4$ (pulse width of second delayed clock 1116).

Turning to an example shortening of a long pulse depicted by FIG. 12B:

At time $T_1$, second delayed clock 1116 exhibits a change from a first state to a second, different, state, here, a rising edge, but this change of second delayed clock 1116 does not affect changed feedback clock signal 120 generation by waveform shaping circuit 1112 because it is received at second input 1120 of waveform shaping circuit 1112.

At time $T_2$, first delayed clock 1114 exhibits a change from a first state to a second, different, state, here, a rising edge. At time $T_2$, waveform shaping circuit 1112 generates changed feedback clock signal 120 exhibiting a change from a first state to a second state (a rising edge) at least partially responsive to detecting the change from the first state to the second state of first delayed clock 1114.

Time duration $\Delta T$ from time $T_1$ to time $T_2$ depicted in FIG. 12B may substantially equal one or more delay increments implemented by variable delay circuit 1104, discussed above.

At time $T_3$, second delayed clock 1116 exhibits a change from the second state to the first state, here, a falling edge. At time $T_3$, waveform shaping circuit 1112 generates changed feedback clock signal 120 exhibiting a change from the second state to the first state (a falling edge) at least partially responsive to detecting the change from the first state to the second state of first delayed clock 1114.

At time $T_4$, first delayed clock 1114 exhibits a change from the second state to the first state, here, a falling edge, but this change of first delayed clock 1114 does not affect changed feedback clock signal 120 generation by waveform shaping circuit 1112. The time duration from $T_2$ to $T_3$ (pulse width of changed feedback clock signal 120) is shorter than the time duration between $T_1$ and $T_3$ (pulse width of second delayed clock 1116) and $T_2$ and $T_4$ (pulse width of first delayed clock 1114).

Figure 13:
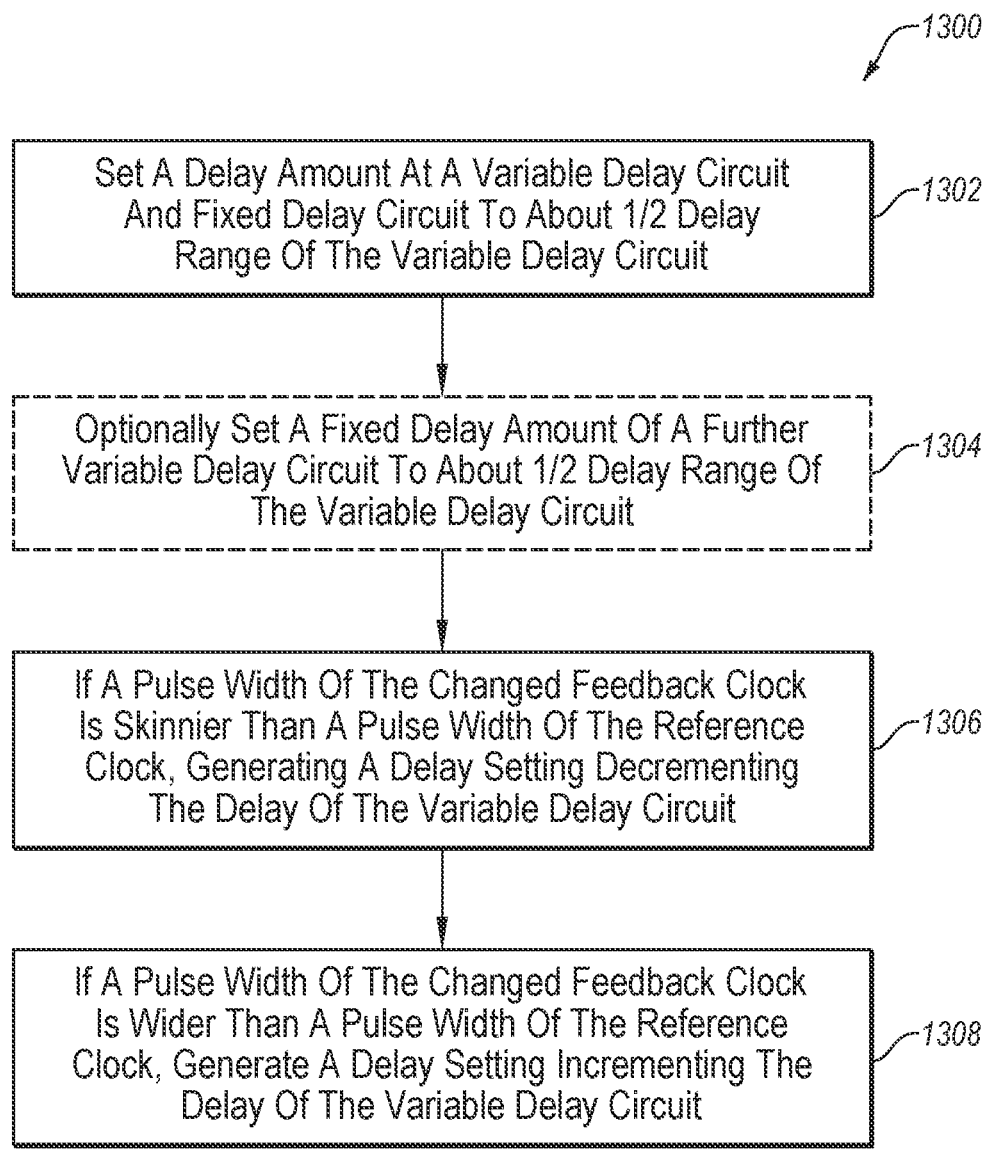
FIG. 13 is a flow diagram depicting a process to generate a delay setting to set the amount of delay at variable delay circuit, in accordance with one or more examples.

FIG. 13 is a flow diagram depicting a process 1300 to generate a delay setting 1122 to set the amount of delay at variable delay circuit 1104, in accordance with one or more examples.

Although the example process 1300 depicts a particular sequence of operations, the sequence may be altered without departing from the scope of the present disclosure. For example, some of the operations depicted may be performed in parallel or in a different sequence that does not materially affect the function of the process 1300. In other examples, different components of an example device or system that implements the process 1300 may perform functions at substantially the same time or in a specific sequence.

At operation 1302, process 1300 sets a delay amount at a variable delay circuit to about ½ delay range of the variable delay circuit.

At operation 1304, process 1300 optionally may set a fixed delay amount at a further variable delay circuit to about ½ the delay range of the variable delay circuit. Alternatively, the delay range of a fixed delay circuit is pre-set to about ½ delay range of the variable delay circuit.

At operation 1306, process 1300, if a pulse width of the changed feedback clock is skinnier than a pulse width of the reference clock, process 1300 generates a delay setting decrementing the delay of the variable delay circuit. This causes the rising edge of the delayed clock generated by the variable delayed circuit to occur earlier in time than before the delay was decremented.

At operation 1308, process 1300, if a pulse width of the changed feedback clock is wider than a pulse width of the reference clock, process 1300 generates a delay setting incrementing the delay of the variable delay circuit. This causes the rising edge of the delayed clock generated by the variable delay circuit to occur later in time than before the delay was incremented.

Figure 14:
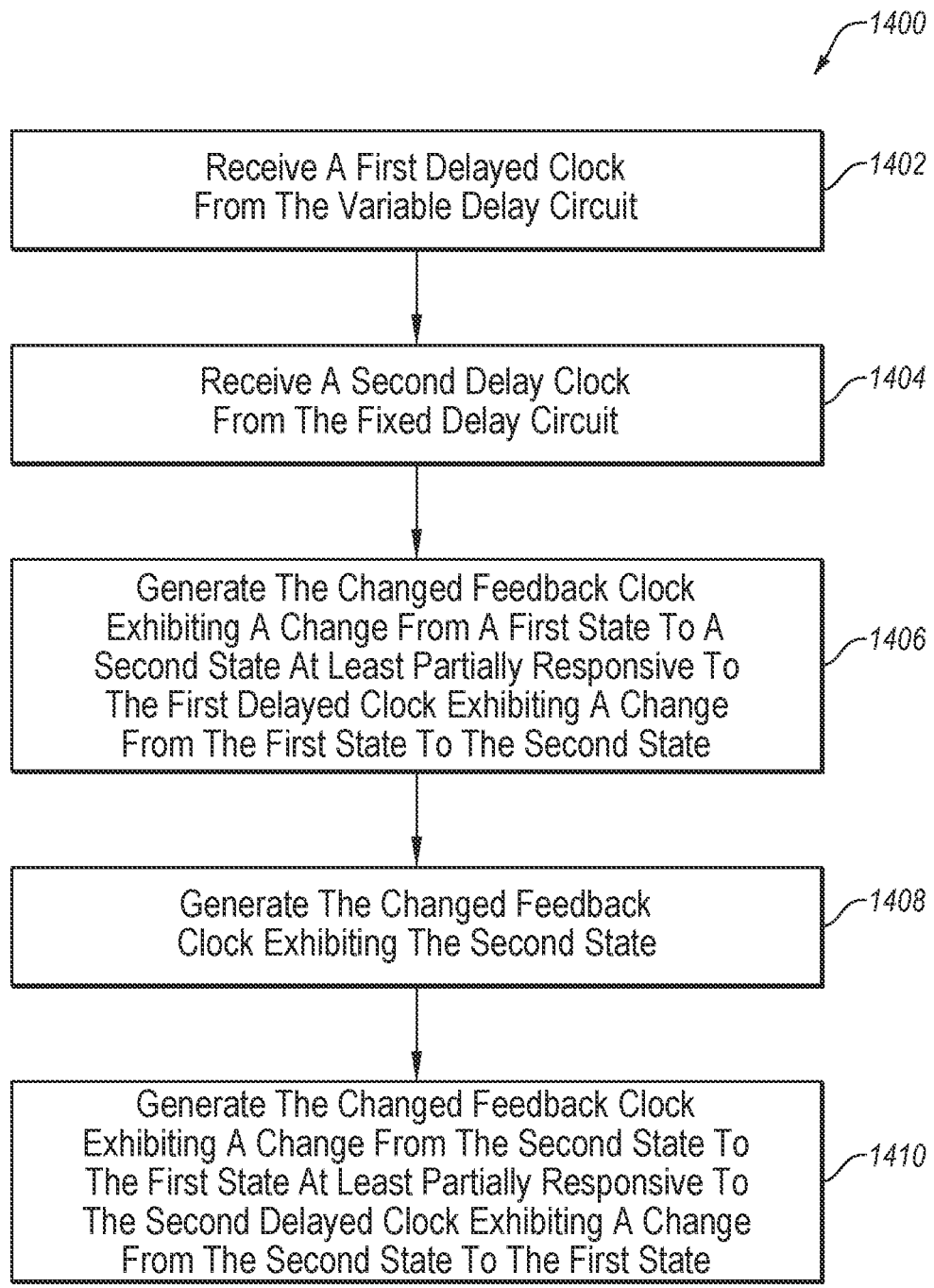
FIG. 14 is a flow diagram depicting a process to generate a changed feedback clock via waveform shaping circuit of FIG. 11, in accordance with one or more examples.

FIG. 14 is a flow diagram depicting a process 1400 to generate a changed feedback clock via waveform shaping circuit 1112 of FIG. 11, in accordance with one or more examples.

Although the example process 1400 depicts a particular sequence of operations, the sequence may be altered without departing from the scope of the present disclosure. For example, some of the operations depicted may be performed in parallel or in a different sequence that does not materially affect the function of the process 1400. In other examples, different components of an example device or system that implements the process 1400 may perform functions at substantially the same time or in a specific sequence.

At operation 1402, process 1400 receives a first delayed clock (e.g., first delayed clock 1114, without limitation) via the variable delay circuit (e.g., variable delay circuit 1104, without limitation).

At operation 1404, process 1400 receives a second delayed clock (e.g., second delayed clock 1116, without limitation) via the fixed delay circuit (e.g., fixed delay circuit 1106, without limitation).

At operation 1406, process 1400 generates a changed feedback clock (e.g., changed feedback clock signal 120, without limitation) exhibiting a change from a first state to a second state (a rising edge) at least partially responsive to the first delayed clock (e.g., first delayed clock 1114, without limitation) exhibiting a change from the first state to the second state (a rising edge).

At operation 1408, process 1400 generates the changed feedback clock (e.g., changed feedback clock signal 120, without limitation) exhibiting the second state. Process 1400 generates the changed feedback clock exhibiting the second state for a time duration between a time when it generates the changed feedback clock exhibiting the rising edge in operation 1406 and a time when it generates the changed feedback clock exhibiting a falling edge in operation 1410, below.

At operation 1410, process 1400 generates the changed feedback clock (e.g., changed feedback clock signal 120, without limitation) exhibiting a change from the second state to the first state (a falling edge) at least partially responsive to the second delayed clock (e.g., second delayed clock 1116, without limitation) exhibiting a change from the second state to the first state (a falling edge).

Figure 15:
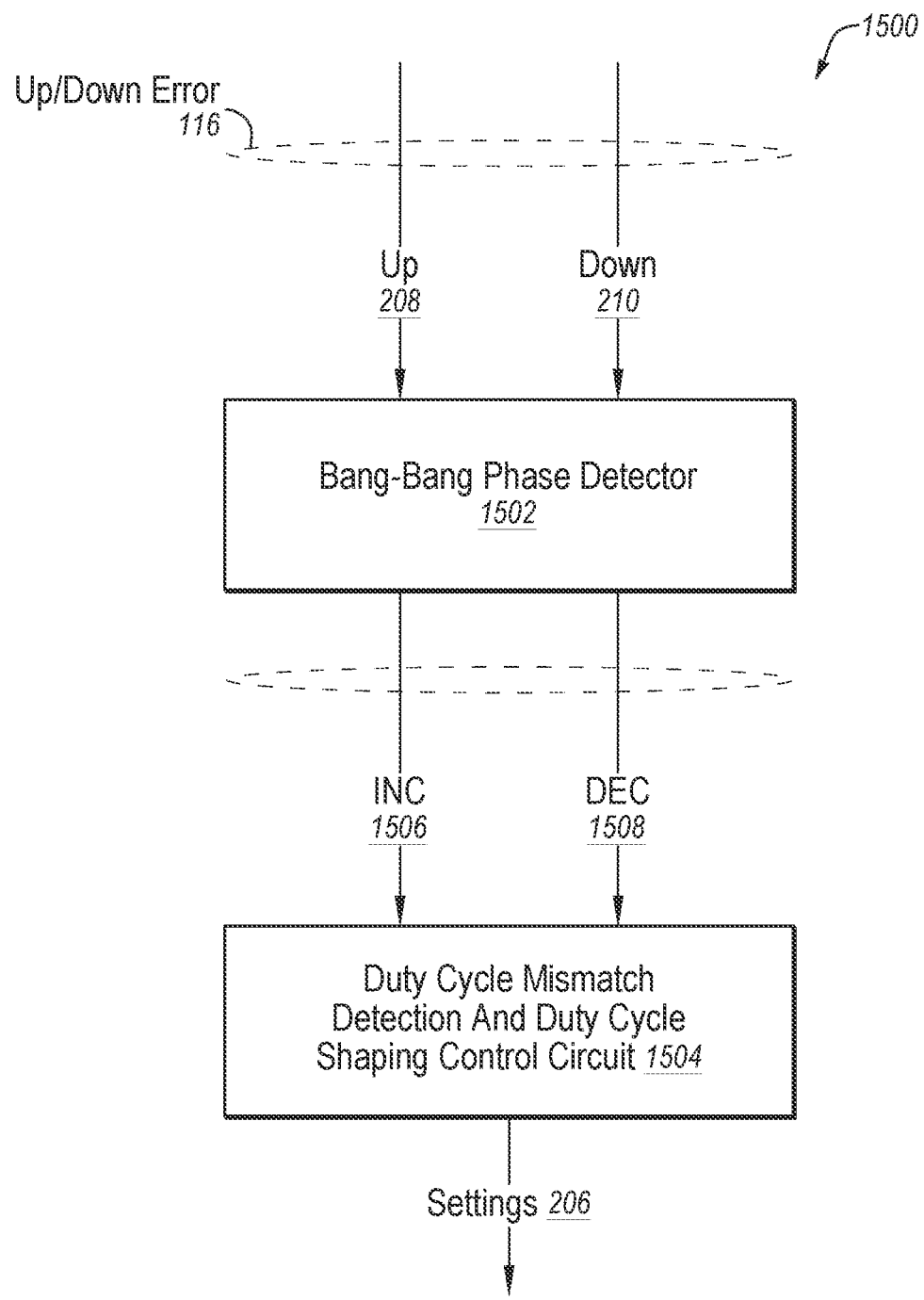
FIG. 15 is a block diagram of an apparatus to detect duty cycle mismatch and determine settings to control pulse width shaping, in accordance with one or more examples.

FIG. 15 is a block diagram of an apparatus 1500 to detect duty cycle mismatch and determine settings to control pulse width shaping, in accordance with one or more examples. Apparatus 1500 is a non-limiting example of a logic circuit 202, logic circuit 302, or logic circuit 1102.

Apparatus 1500 includes a bang-bang phase detector 1502 ("BBPD" 1502) and a duty cycle mismatch detection and duty cycle shaping control circuit 1504.

BBPD 1502 receives UP signal 208 and DOWN signal 210 and generates two signals, increment signal 1506 and decrement signal 1508. In response to receiving a pulse on UP signal 208 ahead in phase of a pulse in DOWN signal 210, BBPD 1502 asserts increment signal 1506 and de-asserts decrement signal 1508. In response to receiving a pulse on DOWN signal 210 ahead in phase of a pulse UP signal 208, BBPD 1502 de-asserts increment signal 1506 and asserts decrement signal 1508.

Duty cycle mismatch detection and duty cycle shaping control circuit 1504 receives the increment signal 1506 and decrement signal 1508 generated by BBPD 1502. If increment signal 1506 is asserted and decrement signal 1508 is de-asserted, duty cycle mismatch detection and duty cycle shaping control circuit 1504 determines a pulse width of changed feedback clock signal 120 is skinnier than a pulse width of reference clock signal 110 and generates settings 206 to lengthen a pulse width of changed feedback clock signal 120. If increment signal 1506 is de-asserted and decrement signal 1508 is asserted, duty cycle mismatch detection and duty cycle shaping control circuit 1504 determines a pulse width of changed feedback clock signal 120 is wider than a pulse width of changed feedback clock signal 120, and generates settings 206 to shorten a pulse width of changed feedback clock signal 120.

If increment signal 1506 and decrement signal 1508 are both asserted or both de-asserted, duty cycle mismatch detection and duty cycle shaping control circuit 1504 does nothing, as these signal states would indicate that the UP signal 208 and DOWN signal 210 were received at BBPD 1502 at the same time.

Figure 16:
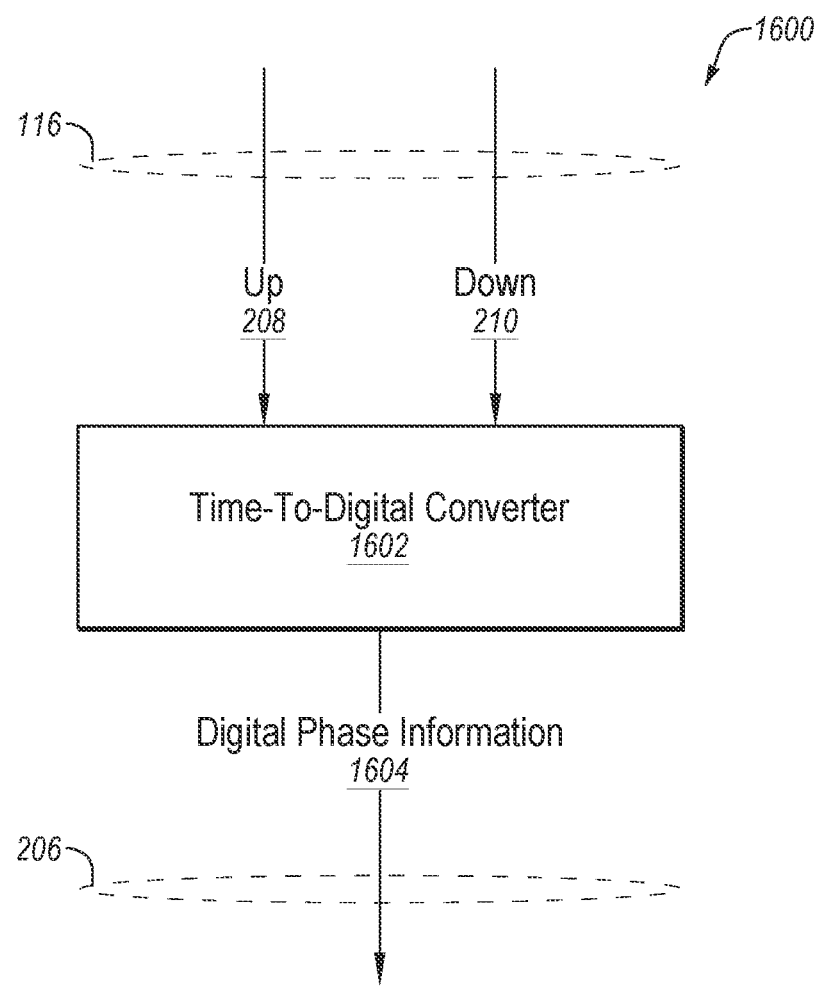
FIG. 16 is a block diagram depicting an apparatus to detect duty cycle mismatch and determine settings to control pulse width shaping, in accordance with one or more examples.

FIG. 16 is a block diagram depicting an apparatus 1600 to detect duty cycle mismatch and determine settings to control pulse width shaping, in accordance with one or more examples. Apparatus 1600 is a non-limiting example of a logic circuit 202, logic circuit 302, or logic circuit 1102.

Apparatus 1600 includes time-to-digital converter 1602 ("TDC 1602").

TDC 1602 receives UP signal 208 and DOWN signal 210 and generates digital phase information 1604. Digital phase information 1604 is a digital representation of the direction and magnitude information in UP signal 208 and DOWN signal 210 of up/down error signals 116. Digital phase information 1604 may be provided directly to duty cycle shaping circuit 204, variable delay circuit 304, variable delay circuit 1104, waveform shaping circuit 330 or waveform shaping circuit 1112. The magnitude information in digital phase information 1604 may be utilized to directly the delay in the variable delay circuits, and the sign information (direction information) may be utilized to directly set the waveform shaping function at the waveform shaping circuit.

Figure 17:
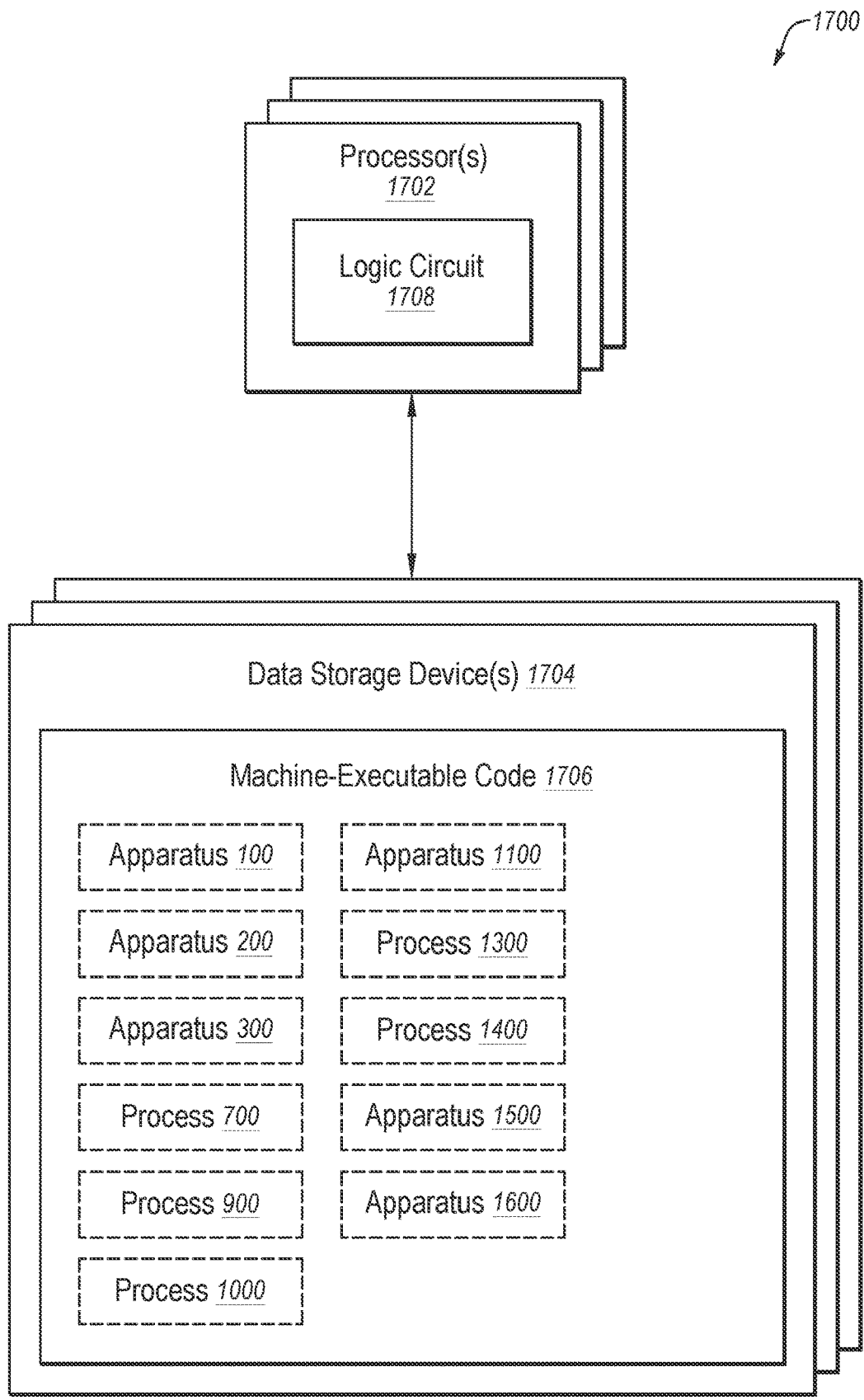
FIG. 17 is a block diagram of circuitry that, in some examples, may be used to implement various functions, operations, acts, processes, or methods disclosed herein.

It will be appreciated by those of ordinary skill in the art that functional elements of examples disclosed herein (e.g., functions, operations, acts, processes, or methods) may be implemented in any suitable hardware, software, firmware, or combinations thereof. FIG. 17 illustrates non-limiting examples of implementations of functional elements disclosed herein. In some examples, some or all portions of the functional elements disclosed herein may be performed by hardware specially configured for carrying out the functional elements.

FIG. 17 is a block diagram of a circuit 1700 that, in some examples, may be used to implement various functions, operations, acts, processes, or methods disclosed herein. The circuit 1700 includes one or more processors 1702 (sometimes referred to herein as "processors 1702") operably coupled to one or more data storage devices 1704 (sometimes referred to herein as "storage 1704"). The storage 1704 includes machine-executable code 1706 stored thereon and the processors 1702 include logic circuit 1708. The machine-executable code 1706 includes information describing functional elements that may be implemented by (e.g., performed by) the logic circuit 1708. The logic circuit 1708 is adapted to implement (e.g., perform) the functional elements described by the machine-executable code 1706. The circuit 1700, when executing the functional elements described by the machine-executable code 1706, should be considered as special purpose hardware configured for carrying out functional elements disclosed herein. In some examples the processors 1702 may be configured to perform the functional elements described by the machine-executable code 1706 sequentially, concurrently (e.g., on one or more different hardware platforms), or in one or more parallel process streams.

When implemented by logic circuit 1708 of the processors 1702, the machine-executable code 1706 adapts the processors 1702 to perform operations of examples disclosed herein. By way of non-limiting example, the machine-executable code 1706 adapts the processors 1702 to perform some or a totality of operations of one or more of: process 700, process 900, process 1000, process 1300, or process 1400.

Also by way of non-limiting example, the machine-executable code 1706 may adapt the processors 1702 to perform some or a totality of features, functions, or operations disclosed herein for one or more of: apparatus 100, including 102, controller 104, controlled-oscillator 106, or duty cycle matching circuit 108; apparatus 200 including, logic circuit 202, or duty cycle shaping circuit 204; apparatus 300, including, logic circuit 302, variable delay circuit 304, delay cells 326, fixed delay circuit 306, delay cells 328, waveform shaping circuit 330, wide logic circuit 314, skinny logic circuit 316, or multiplexer 308; apparatus 1100, including, logic circuit 1102, variable delay circuit 1104, delay cells 1108, fixed delay circuit 1106, delay cells 1110, second input 1120, first input 1118, or second input 1120; apparatus 1500, including BBPD 1502 or duty cycle mismatch detection and duty cycle shaping control circuit 1504; or apparatus 1600, including TDC 1602.

The processors 1702 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein.

A general-purpose computer including a processor is considered a special-purpose computer while the general-purpose computer is configured to execute functional elements corresponding to the machine-executable code 1706 (e.g., software code, firmware code, hardware descriptions) related to examples of the present disclosure. It is noted that a general-purpose processor (may also be referred to herein as a host processor or simply a host) may be a microprocessor, but in the alternative, the processors 1702 may include any conventional processor, controller, microcontroller, or state machine. The processors 1702 may also be implemented as a combination of computing devices, such as a combination of a DSP and a microprocessor, a plurality of microprocessors, one or more microprocessors in conjunction with a DSP core, or any other such configuration.

In some examples the storage 1704 includes volatile data storage (e.g., random-access memory (RAM)), non-volatile data storage (e.g., Flash memory, a hard disc drive, a solid-state drive, erasable programmable read-only memory (EPROM), without limitation). In some examples the processors 1702 and the storage 1704 may be implemented into a single device (e.g., a semiconductor device product, a system on chip (SOC), without limitation). In some examples the processors 1702 and the storage 1704 may be implemented into separate devices.

In some examples the machine-executable code 1706 may include computer-readable instructions (e.g., software code, firmware code). By way of non-limiting example, the computer-readable instructions may be stored by the storage 1704, accessed directly by the processors 1702, and executed by the processors 1702 using at least the logic circuit 1708. Also by way of non-limiting example, the computer-readable instructions may be stored on the storage 1704, transferred to a memory device (not shown) for execution, and executed by the processors 1702 using at least the logic circuit 1708. Accordingly, in some examples the logic circuit 1708 includes electrically configurable logic circuit 1708.

In some examples the machine-executable code 1706 may describe hardware (e.g., circuitry) to be implemented in the logic circuit 1708 to perform the functional elements. This hardware may be described at any of a variety of levels of abstraction, from low-level transistor layouts to high-level description languages. At a high level of abstraction, a hardware description language (HDL) such as an IEEE Standard hardware description language (HDL) may be used. By way of non-limiting examples, VERILOG, SystemVerilog or very large-scale integration (VLSI) hardware description language (VHDL) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuit 1708 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples the machine-executable code 1706 may include an HDL, an RTL, a GL description, a mask level description, other hardware description, or any combination thereof.

In examples where the machine-executable code 1706 includes a hardware description (at any level of abstraction), a system (not shown, but including the storage 1704) may implement the hardware description described by the machine-executable code 1706. By way of non-limiting example, the processors 1702 may include a programmable logic device (e.g., an FPGA or a PLC) and the logic circuit 1708 may be electrically controlled to implement circuitry corresponding to the hardware description into the logic circuit 1708. Also by way of non-limiting example, the logic circuit 1708 may include hard-wired logic manufactured by a manufacturing system (not shown, but including the storage 1704) according to the hardware description of the machine-executable code 1706.

Regardless of whether the machine-executable code 1706 includes computer-readable instructions or a hardware description, the logic circuit 1708 is adapted to perform the functional elements described by the machine-executable code 1706 when implementing the functional elements of the machine-executable code 1706. It is noted that although a hardware description may not directly describe functional elements, a hardware description indirectly describes functional elements that the hardware elements described by the hardware description are capable of performing.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, without limitation) of the computing system. In some examples, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means "some or a totality." As used herein, the term "each and every" means a "totality."

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, without limitation" or "one or more of A, B, and C, without limitation" is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional Non-Limiting Examples Include:

Example 1: An apparatus, comprising: a duty-cycle shaping circuit to set a duty-cycle of a changed feedback clock that represents an output clock generated by a clock tracking circuit to track a reference clock; and a logic circuit to set the duty-cycle shaping circuit to reduce duty cycle mismatch between the reference clock and the changed feedback clock indicated by up/down error signal signals.

Example 2: The apparatus according to Example 1, wherein the duty-cycle shaping circuit comprises: a variable delay circuit to generate a first delayed clock at least partially responsive to the changed feedback clock; a fixed delay circuit to generate a second delayed clock at least partially responsive to the changed feedback clock; and a waveform shaping circuit to shape a waveform of the changed feedback clock at least partially responsive to the first delayed clock and the second delayed clock.

Example 3: The apparatus according to Examples 1 and 2, wherein the logic circuit to set the duty-cycle shaping circuit by: generating a delay setting to set a delay of the variable delay circuit; and generating a waveform shaping setting to set a waveform shaping function of the waveform shaping circuit.

Example 4: The apparatus according to Examples 1 to 3, wherein the delay setting indicates an increment or a decrement.

Example 5: The apparatus according to Examples 1 to 4, wherein the waveform shaping circuit comprises: a wide logic circuit to generate a first changed clock having a pulse width shorter than the pulse width of the changed feedback clock; a skinny logic circuit to generate a second changed clock having a pulse width longer than the pulse width of the changed feedback clock; and a multiplexer to selectively provide one of the first changed clock or the second changed clock as the changed feedback clock as indicated by the waveform shaping setting.

Example 6: The apparatus according to Examples 1 to 5, wherein the logic circuit to set a delay at the variable delay circuit by: if a pulse width of the changed feedback clock signal is skinnier than a pulse width of the reference clock signal, generating a delay setting to decrement the delay of the variable delay circuit; if a pulse width of the changed feedback clock signal is wider than a pulse width of the reference clock signal, generating a delay setting to increment the delay of the variable delay circuit.

Example 7: The apparatus according to Examples 1 to 6, wherein the waveform shaping circuit comprising: a first input coupled to receive a first delayed clock from variable delay circuit; and a second input coupled to receive the second delayed clock from the fixed delay circuit.

Example 8: The apparatus according to Examples 1 to 7, wherein the waveform shaping circuit to: generate the changed feedback clock exhibiting a change from a first state to a second state at least partially responsive to the first delayed clock exhibiting a change from the first state to the second state; and generate the changed feedback clock exhibiting a change from the second state to the first state at least partially responsive to the second delayed clock exhibiting a change from the second state to the first state.

Example 9: The apparatus according to Examples 1 to 8, wherein the clock tracking circuit is chosen from a group, the group including: a hybrid phase locked loop (PLL), an analog PLL, a digital PLL, a delay locked loop, an injection locked loop, or a frequency synthesizer.

Example 10: The apparatus according to Examples 1 to 9, wherein the logic circuit comprises: a bang-bang phase detector; and a duty cycle mismatch detection and duty cycle shaping control circuit.

Example 11: The apparatus according to Examples 1 to 10, wherein the logic circuit comprises: a time-to-digital-converter.

Example 12: A method, comprising: receiving up/down error signals indicative of duty cycle mismatch between a reference clock signal and a changed feedback clock signal that represents an output clock signal generated by a clock tracking circuit to track the reference clock signal; setting a duty cycle of a changed feedback clock signal to reduce duty cycle mismatch indicated by the up/down error signals; and providing the changed feedback clock having set duty cycle.

Example 13: The method according to Example 12, wherein setting the duty cycle of the changed feedback clock signal to reduce duty cycle mismatch indicated by the up/down error signals comprises: determining settings to generate waveform shaping signals for shaping the changed feedback clock signal to reduce duty cycle mismatch between the changed feedback clock signal and the reference signal; determining a waveform shaping function for shaping the changed feedback clock signal to reduce duty cycle mismatch between the changed feedback clock signal and the reference signal; and providing settings to a duty-cycle shaping circuit to set the duty cycle of the changed feedback clock, the settings including the determined settings to generate waveform shaping signals and the determined waveform shaping function.

Example 14: The method according to Examples 12 and 13, wherein setting the duty cycle of the changed feedback clock to reduce duty cycle mismatch indicated by the up/down error signals comprises: setting a delay at a variable delay circuit; delaying a feedback clock at the variable delay circuit to generate a first delayed clock; delaying the feedback clock at a fixed delay circuit to generate a second delayed clock; and shaping a waveform of the changed feedback clock at least partially responsive to the first delayed clock and the second delayed clock.

Example 15: The method according to Examples 12 to 14, wherein an amount of delay by which the delay at the variable delay circuit is set is a predetermined amount of delay.

Example 16: The method according to Examples 12 to 15, wherein shaping the waveform of the changed clock at least partially responsive to the first delayed clock and the second delayed clock comprises: if a pulse width of the changed feedback clock signal is skinner than the pulse width of the reference clock signal, then instruct a waveform shaping circuit to lengthen the pulse width of the changed feedback clock signal.

Example 17: The method according to Examples 12 to 16, wherein shaping the waveform of the changed clock at least partially responsive to the first delayed clock and the second delayed clock comprises: if a pulse width of the changed feedback clock signal is wider than the pulse width of the reference clock signal, then instruct the waveform shaping circuit to shorten the pulse width of the changed feedback clock signal.

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus, comprising:
   a duty-cycle shaping circuit to set a duty-cycle of a changed feedback clock that represents an output clock generated by a clock tracking circuit to track a reference clock; and
   a logic circuit to set the duty-cycle shaping circuit to reduce duty cycle mismatch between the reference clock and the changed feedback clock indicated by up/down error signals, wherein duty cycle mismatch between the reference clock and the changed feedback clock is a difference between the duty cycle of the changed feedback clock and a duty cycle of the reference clock.

2. The apparatus of claim 1, wherein the duty-cycle shaping circuit comprises:
   a variable delay circuit to generate a first delayed clock at least partially responsive to the changed feedback clock;
   a fixed delay circuit to generate a second delayed clock at least partially responsive to the changed feedback clock; and
   a waveform shaping circuit to shape a waveform of the changed feedback clock at least partially responsive to the first delayed clock and the second delayed clock.

3. The apparatus of claim 2, wherein the logic circuit to set the duty-cycle shaping circuit by:
   generating a delay setting to set a delay of the variable delay circuit; and
   generating a waveform shaping setting to set a waveform shaping function of the waveform shaping circuit.

4. The apparatus of claim 3, wherein the delay setting indicates an increment or a decrement.

5. The apparatus of claim 3, wherein the waveform shaping circuit comprises:
   a wide logic circuit to generate a first changed clock having a pulse width shorter than the pulse width of the changed feedback clock;
   a skinny logic circuit to generate a second changed clock having a pulse width longer than the pulse width of the changed feedback clock; and
   a multiplexer to selectively provide one of the first changed clock or the second changed clock as the changed feedback clock as indicated by the waveform shaping setting.

6. The apparatus of claim 2, wherein the logic circuit to set a delay at the variable delay circuit by:
   if a pulse width of the changed feedback clock signal is skinnier than a pulse width of the reference clock signal, generating a delay setting to decrement the delay of the variable delay circuit; and
   if a pulse width of the changed feedback clock signal is wider than a pulse width of the reference clock signal, generating a delay setting to increment the delay of the variable delay circuit.

7. The apparatus of claim 6, wherein the waveform shaping circuit comprising:
   a first input coupled to receive a first delayed clock from variable delay circuit; and
   a second input coupled to receive the second delayed clock from the fixed delay circuit.

8. The apparatus of claim 6, wherein the waveform shaping circuit to:
   generate the changed feedback clock exhibiting a change from a first state to a second state at least partially responsive to the first delayed clock exhibiting a change from the first state to the second state; and
   generate the changed feedback clock exhibiting a change from the second state to the first state at least partially responsive to the second delayed clock exhibiting a change from the second state to the first state.

9. The apparatus of claim 1, wherein the clock tracking circuit is chosen from a group, the group including: a hybrid phase locked loop (PLL), an analog PLL, a digital PLL, a delay locked loop, an injection locked loop, or a frequency synthesizer.

10. The apparatus of claim 1, wherein the logic circuit comprises:
    a bang-bang phase detector; and
    a duty cycle mismatch detection and duty cycle shaping control circuit.

11. The apparatus of claim 1, wherein the logic circuit comprises:
    a time-to-digital-converter.

12. A method, comprising:
    receiving up/down error signals indicative of duty cycle mismatch between a reference clock signal and a changed feedback clock signal that represents an output clock signal generated by a clock tracking circuit to track the reference clock signal;
    setting a duty cycle of a changed feedback clock signal to reduce duty cycle mismatch indicated by the up/down error signals, wherein duty cycle mismatch indicated by the up/down error signals is a difference between the duty cycle of the changed feedback clock and a duty cycle of the reference clock; and
    providing the changed feedback clock having set duty cycle.

13. The method of claim 12, wherein setting the duty cycle of the changed feedback clock signal to reduce duty cycle mismatch indicated by the up/down error signals comprises:
- determining settings to generate waveform shaping signals for shaping the changed feedback clock signal to reduce duty cycle mismatch between the changed feedback clock signal and the reference clock signal;
- determining a waveform shaping function for shaping the changed feedback clock signal to reduce duty cycle mismatch between the changed feedback clock signal and the reference clock signal; and
- providing settings to a duty-cycle shaping circuit to set the duty cycle of the changed feedback clock, the settings including the determined settings to generate waveform shaping signals and the determined waveform shaping function.

14. The method of claim 12, wherein setting the duty cycle of the changed feedback clock to reduce duty cycle mismatch indicated by the up/down error signals comprises:
- setting a delay at a variable delay circuit;
- delaying a feedback clock at the variable delay circuit to generate a first delayed clock;
- delaying the feedback clock at a fixed delay circuit to generate a second delayed clock; and
- shaping a waveform of the changed feedback clock at least partially responsive to the first delayed clock and the second delayed clock.

15. The method of claim 14, wherein an amount of delay by which the delay at the variable delay circuit is set is a predetermined amount of delay.

16. The method of claim 14, wherein shaping the waveform of the changed feedback clock at least partially responsive to the first delayed clock and the second delayed clock comprises:
- if a pulse width of the changed feedback clock signal is skinner than the pulse width of the reference clock signal, then instruct a waveform shaping circuit to lengthen the pulse width of the changed feedback clock signal.

17. The method of claim 14, wherein shaping the waveform of the changed feedback clock at least partially responsive to the first delayed clock and the second delayed clock comprises:
- if a pulse width of the changed feedback clock signal is wider than the pulse width of the reference clock signal, then instruct the waveform shaping circuit to shorten the pulse width of the changed feedback clock signal.

\* \* \* \* \*